(12) United States Patent
Takeuchi et al.

(10) Patent No.: US 6,796,011 B2
(45) Date of Patent: Sep. 28, 2004

(54) PIEZOELECTRIC/ELECTROSTRICTIVE DEVICE AND METHOD OF MANUFACTURING SAME

(75) Inventors: Yukihisa Takeuchi, Nishikamo-Gun (JP); Tsutomu Nanataki, Toyoake (JP); Masahiko Namerikawa, Seto (JP); Koji Kimura, Nagoya (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 162 days.

(21) Appl. No.: 10/106,141

(22) Filed: Mar. 26, 2002

(65) Prior Publication Data

US 2002/0101133 A1 Aug. 1, 2002

Related U.S. Application Data

(62) Division of application No. 09/671,587, filed on Sep. 27, 2000, now Pat. No. 6,455,984.

(30) Foreign Application Priority Data

| Oct. 1, 1999 | (JP) | 11-281522 |
| Oct. 28, 1999 | (JP) | 11-307844 |
| Nov. 16, 1999 | (JP) | 11-326195 |
| Dec. 27, 1999 | (JP) | 11-371967 |
| Jan. 21, 2000 | (JP) | 2000-013576 |
| Jan. 24, 2000 | (JP) | 2000-015123 |
| Mar. 1, 2000 | (JP) | 2000-056434 |
| Sep. 1, 2000 | (JP) | 2000-265902 |

(51) Int. Cl.[7] .................. H04R 17/00; H01L 41/04; H01L 41/08; H01L 41/18
(52) U.S. Cl. .................. 29/25.35; 29/25.42; 29/830; 29/609; 310/328
(58) Field of Search .............. 29/25.35, 25.42, 29/830, 609; 310/328

(56) References Cited

U.S. PATENT DOCUMENTS 4,651,042 A * 3/1987 Nakamura et al. .......... 310/321
5,063,321 A   11/1991 Carter (List continued on next page.)

FOREIGN PATENT DOCUMENTS

EP         1 017 116 A2    7/2000

(List continued on next page.)

OTHER PUBLICATIONS

U.S. patent application Ser. No. 09/878,773, Ikeda et al., filed Jun. 11, 2001.

U.S. patent application Ser. No. 09/663,145, Takeuchi et al., filed Sep. 15, 2000.

(List continued on next page.)

Primary Examiner—Carl J. Arbes
Assistant Examiner—Tai Nguyen
(74) Attorney, Agent, or Firm—Burr & Brown

(57) ABSTRACT

A piezoelectric/electrostrictive device includes a pair of mutually opposing thin plate sections, a movable section, and a fixing section for supporting the thin plate sections and the movable section. Piezoelectric/electrostrictive elements are arranged on at least one thin plate section of the pair of thin plate sections. A hole is formed by both inner walls of the pair of thin plate sections, an inner wall of the movable section, and an inner wall of the fixing section. The piezoelectric/electrostrictive device has a mechanism for restricting amplitude of the thin plate sections. The mechanism includes a cavity portion formed in the inner wall of the movable section and a stopper member provided on the inner wall of the fixing section, wherein the forward end of the stopper member extends into the cavity portion.

3 Claims, 26 Drawing Sheets

U.S. PATENT DOCUMENTS

| | | | |
|---|---|---|---|
| 5,281,888 A | * 1/1994 | Takeuchi et al. | 310/366 |
| 5,691,594 A | 11/1997 | Takeuchi et al. | |
| 5,693,997 A | 12/1997 | Griffith et al. | |
| 5,774,961 A | * 7/1998 | Takeuchi et al. | 29/25.35 |
| 5,825,119 A | * 10/1998 | Shibata et al. | 310/338 |
| 5,852,456 A | * 12/1998 | Okada et al. | 347/71 |
| 5,860,202 A | * 1/1999 | Okawa et al. | 29/25.35 |
| 5,912,524 A | 6/1999 | Ohnishi et al. | |
| 5,969,248 A | 10/1999 | Kurachi et al. | |
| 6,049,158 A | 4/2000 | Takeuchi et al. | |
| 6,109,104 A | 8/2000 | Fukuda et al. | |
| 6,140,739 A | 10/2000 | Arai et al. | |
| 6,262,516 B1 | 7/2001 | Fukuda et al. | |
| 6,267,146 B1 | 7/2001 | Miyazoe et al. | |
| 6,323,582 B1 | 11/2001 | Takeuchi et al. | |
| 6,329,740 B1 | 12/2001 | Hirota et al. | |
| 6,333,681 B1 | 12/2001 | Takeuchi et al. | |
| 6,335,586 B1 | 1/2002 | Takeuchi et al. | |
| 6,342,751 B1 | 1/2002 | Takeuchi et al. | |
| 6,351,056 B1 | 2/2002 | Takeuchi et al. | |
| 2002/0013987 A1 | 2/2002 | Hirota et al. | |

FOREIGN PATENT DOCUMENTS

| | | |
|---|---|---|
| EP | 1 089 351 A2 | 4/2001 |
| EP | 1 089 352 A2 | 4/2001 |
| EP | 1 089 356 A2 | 4/2001 |
| EP | 1 089 358 A2 | 4/2001 |
| JP | 61-183981 | 8/1986 |
| JP | 62-168535 | 10/1987 |
| JP | 63-64640 | 3/1988 |
| JP | 1-107997 | 7/1989 |
| JP | 02-119278 | 5/1990 |
| JP | 2-159982 | 6/1990 |
| JP | 10-136665 | 5/1998 |
| JP | 11-051959 | 2/1999 |
| WO | 01/26166 A1 | 4/2001 |
| WO | 01/26169 A1 | 4/2001 |

OTHER PUBLICATIONS

U.S. patent application Ser. No. 09/642,861, Yukihisa Takeuchi et al., filed Aug. 21, 2000.

U.S. patent application Ser. No. 09/643,163, Yukihisa Takeuchi et al., filed Aug. 21, 2000.

U.S. patent application Ser. No. 09/524,042, Yukihisa Takeuchi et al., filed Mar. 13, 2000.

U.S. patent application Ser. No. 09/544,013, Yukihisa Takeuchi et al., filed Apr. 6, 2000.

U.S. patent application Ser. No. 09/613,536, Yukihisa Takeuchi et al., filed Jul. 10, 2000.

Yoshikazu Soeno, et al., "*Piezoelectric Piggy–Back Microactuator for Hard Disk Drive*," IEEE Transactions on Magnetics, vol. 35, No. 2, Mar. 1999, pp 983–987.

S. Koganezawa, et al., "*Dual–Stage Actuator System for Magnetic Disk Drives Using a Shear Mode Piezoelectric Microactuactor*," IEEE Transactions on Magnetic, vol. 35, No. 2, Mar. 1999, pp 998–992.

U.S. patent application Ser. No. 09/683,477, Yukihisa Takeuchi et al., filed Jan. 4, 2002.

U.S. patent application Ser. No. 10/237,495, Ikeda et al., filed Sep. 9, 2002.

U.S. patent application Ser. No. 10/211,872, Takeuchi et al., filed Aug. 20, 2002.

* cited by examiner

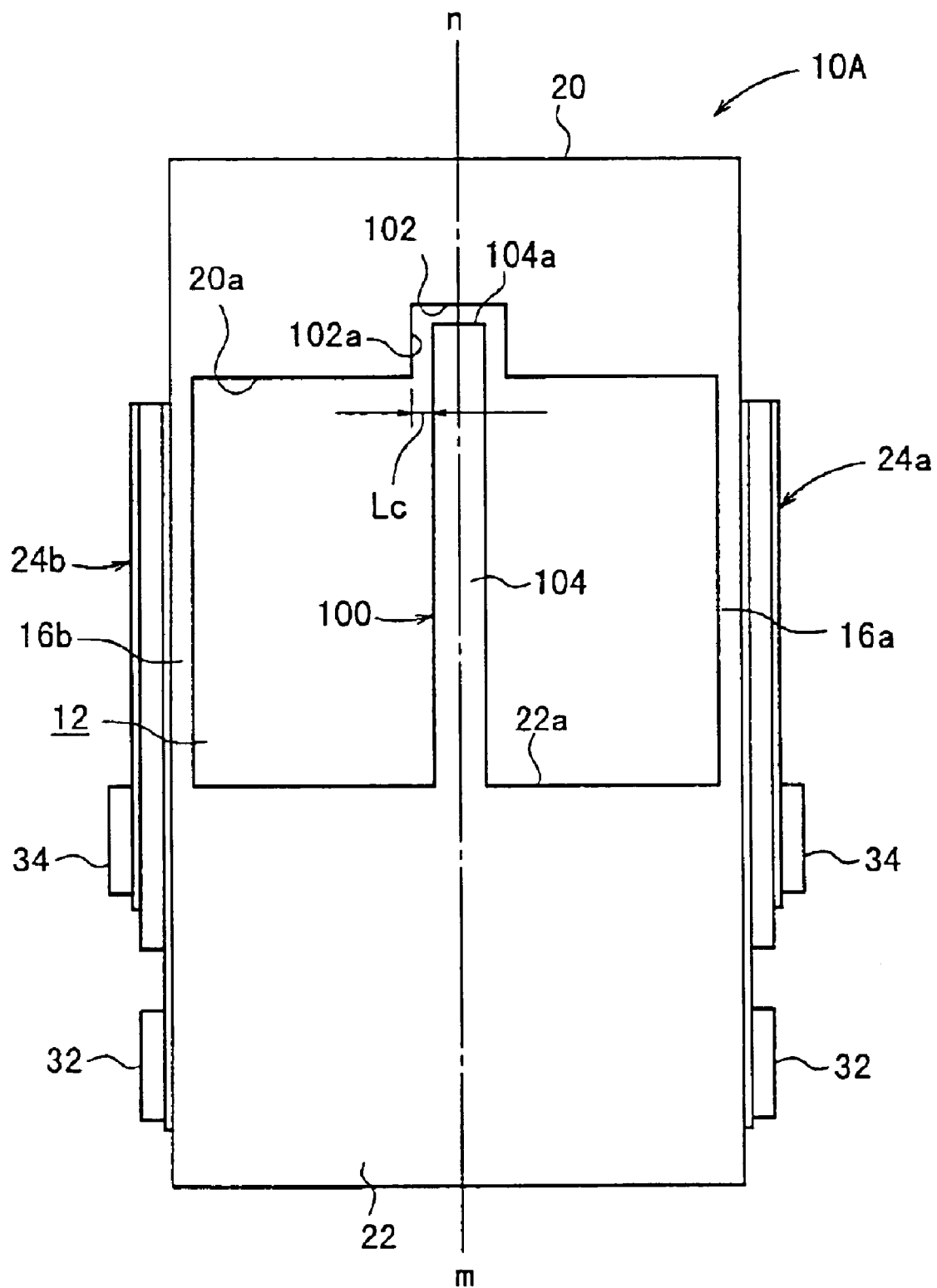

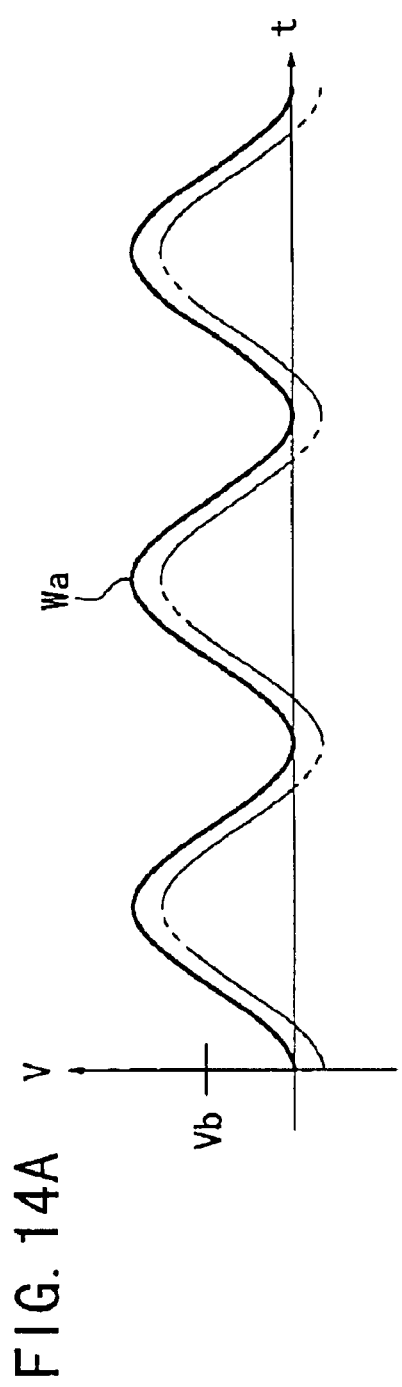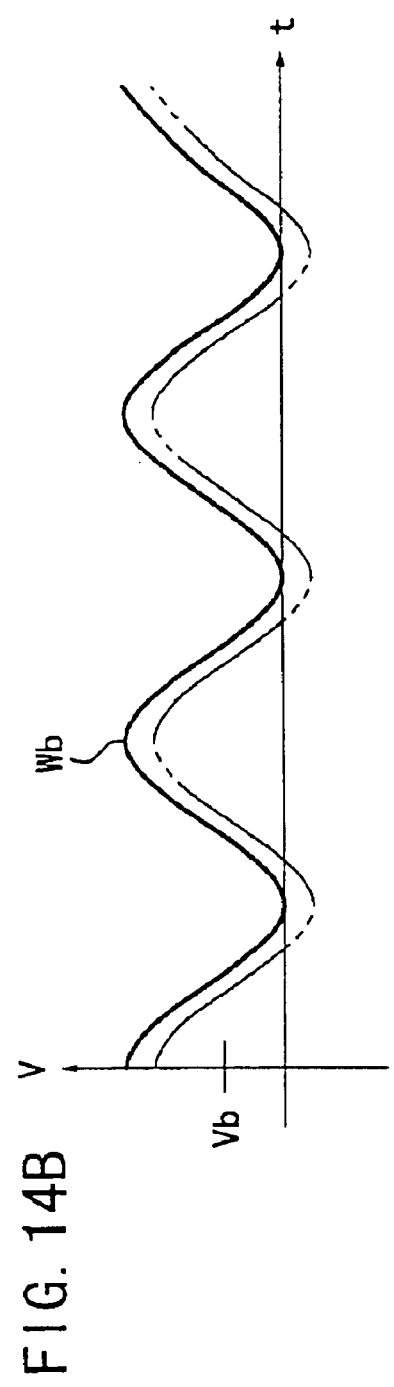

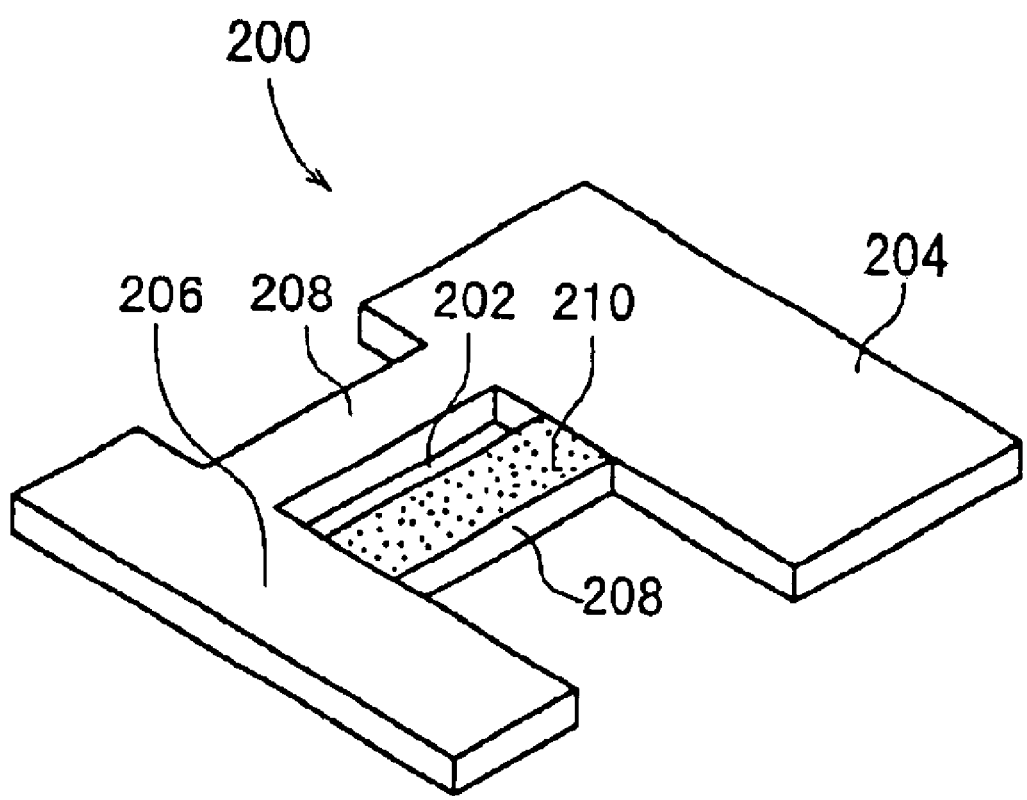

PIEZOELECTRIC/ELECTROSTRICTIVE DEVICE AND METHOD OF MANUFACTURING SAME

CROSS REFERENCE TO RELATED APPLICATION

This application is a divisional which claims the benefit of U.S. application Ser. No. 09/671,587 filed Sep. 27, 2000, now U.S. Pat. No. 6,455,984 the entirety of which is incorporated herein by reference.

BACKGROUND OF THE INVENTION

1. Field of the Invention

The present invention relates to a piezoelectric/electrostrictive device that is provided with a movable section to be operated on the basis of a displacement action of a piezoelectric/electrostrictive element, or a piezoelectric/electrostrictive device that is capable of detecting displacement of a movable section by the aid of a piezoelectric/electrostrictive element, and a method for producing the same. In particular, the invention relates to a piezoelectric/electrostrictive device that is excellent in strength, shock resistance, and moisture resistance and that makes it possible to efficiently operate a movable section to a great extent, and a method for producing the same.

2. Background of the Invention

Recently, a displacement element, which makes it possible to adjust the optical pat length and the position in an order of submicron, is demanded, for example, in the fields o optics, magnetic recording, and precision machining. Development is advanced for the displacement element based on the use of the displacement brought about by the inverse piezoelectric effect or the electrostrictive effect caused when a voltage is applied to a piezoelectric/electrostrictive material (for example, a ferroelectric material.

As shown in FIG. 26, for example, those hitherto disclosed as such a displacement element include a piezoelectric actuator comprising a fixing section 204, a movable section 206, and a beam section 208 for supporting the fixing and movable sections, which are formed integrally with a hole 202 provided through a plate-shaped member 200 composed of a piezoelectric/electrostrictive material and with an electrode layer 210 provided on the beam section 208 (see, for example, Japanese Laid-Open Patent Publication No. 10-136665).

The piezoelectric actuator is operated such that when a voltage is applied to the electrode layer 210, the beam section 208 makes expansion and contraction in a direction along a line obtained by connecting the fixing section 204 and the movable section 206 in accordance with the inverse piezoelectric effect or the electrostrictive effect. Therefore, the movable section 206 can perform circular arc-shaped displacement or rotational displacement in the plane of the plate-shaped member 200.

On the other hand, Japanese Laid-Open Patent Publication No. 63-64640 discloses a technique in relation to an actuator based on the use of a bimorph. In this technique, the electrodes of the bimorph actuator are provided in a divided manner. The actuator is driven by selecting the divided electrodes, and thus highly accurate positioning is performed at a high speed. JP '640 discloses a structure (especially in FIG. 4) in which, for example, two opposed bimorphs are used.

However, the piezoelectric actuator described above involves a problem that the amount of operation of the movable section 206 is small, because the displacement in the direction of extension and contraction of the piezoelectric/electrostrictive material (i.e., in the in-plane direction of the plate-shaped member 200) is transmitted to the movable section 206 as it is.

Since all the parts of the piezoelectric actuator are made of piezoelectric/electrostrictive materials, which are fragile materials having a relatively heavy weight, the mechanical strength is low, and the piezoelectric actuator is inferior in handling performance, shock resistance, and moisture resistance. Furthermore, the piezoelectric actuator itself is heavy, and its operation tends to be affected by harmful vibrations (for example, residual vibration and noise vibration during high speed operator).

Then, a method may be proposed which increases the strength and the resonant frequency by thickening a beam portion, for example, in order to improve stiffness. However, displacement and a response speed are significantly deteriorated due to the improvement of stiffness.

Further, the following structure is disclosed in FIG. 4 in Japanese Laid-Open Patent Publication No. 63-64640, a joined form exists between a mediating member and a bimorph and between a head and the bimorph (i.e., so-called piezoelectric operating sections, both of which cause the strain). In other words, the bimorph is formed continuously ranging from the mediating member to the bead.

As a result, when the bimorph is operated, the displacement action, which is effected with the supporting point of the joined portion between the mediating member and the bimorph, mutually interferes with the displacement action which is effected with the supporting point of the joined point between the head and the bimorph. The expression of the displacement is inhibited. In this structure, it is impossible to obtain a function that the head is greatly displaced with respect to the external space.

The conventional device of this type has a structure which is weak against external forces in many situations. A problem arises in that it is difficult to handle the device and to achieve the realization of a high resonance frequency.

SUMMARY OF THE INVENTION

The present invention has been made taking the foregoing problems into consideration, and an object thereof is to provide a piezoelectric/electrostrictive device and a method for manufacturing the same. According to the piezoelectric/electrostrictive device of the present invention, it is possible to obtain a displacement element that is easy in handling, high in shock resistance against external forces without deteriorating the device characteristics such as the displacement characteristic and the response characteristic, and scarcely affected by harmful vibration, and that is capable of large displacement and high speed response with high mechanical strength while being excellent in moisture resistance, as well as a sensor element that makes it possible to accurately detect vibration of the movable section.

Further, an object of the present invention is to provide a piezoelectric/electrostrictive device and a method for manufacturing the same which can suppress occurrence of problems caused by unnecessary vibration during its manufacture and improve the productivity of manufacturing the piezoelectric/electrostrictive device.

According to the present invention, a piezoelectric/electrostrictive device has a pair of mutually opposing thin plate sections, a movable section, and a fixing section for supporting the thin plate sections and the movable section, the piezoelectric/electrostrictive device includes: one or more piezoelectric/electrostrictive elements arranged on at least one thin plate section of the pair of thin plate sections, and a hole is formed by both inner walls of the pair of thin plate sections, an inner wall of the movable section, and an inner wall of the fixing section.

A mechanism is provided for restricting amplitude of the thin plate sections. Thus, when the external force is applied to the thin plate section and the movable section, which causes their large vibration (amplitude), the mechanism can restrict the vibration (amplitude) of the thin plate section. As a result, it can prevent the thin plate section from being damaged. In this case, the thin plate section does not need to be thickened. Therefore, material characteristics of the piezoelectric/electrostrictive element provided on the thin plate section are not deteriorated, which does not correspondingly deteriorate device characteristics such as the displacement characteristic and the response characteristic.

In other words, the present invention can provide a displacement element that is easy in handling, high in shock resistance against the external force without deteriorating the device characteristics such as the displacement characteristic and the response characteristic, and is scarcely affected by harmful vibration, and that is capable of a large displacement and high speed response with high mechanical strength while being excellent in moisture resistance, as well as a sensor element that makes it possible to accurately detect vibration of the movable section.

Further, when unnecessary vibration is applied during production, the mechanism can restrict the vibration (amplitude) of the thin plate section. Therefore, damage to the thin plate section due to the unnecessary vibration can be prevented effectively, which can improve the productivity of manufacturing the piezoelectric/electrostrictive device.

The mechanism may have a cavity portion formed on the inner wall of the movable section and a stopper member provided on the inner wall of the fixing section having a forward end extending into the cavity portion. Alternatively, the mechanism may have a cavity portion formed on the inner wall of the fixing section and a stopper member provided on the inner wall of the movable section having a forward end extended into the cavity portion. In this case, when the forward end of the stopper member hits the cavity portion, vibration (amplitude) of the thin plate section is restricted thereby. Further, the appropriately adjusted length and thickness of the stopper member gives resilience to the stopper member so as to absorb shocks caused when the stopper member hits the cavity portion.

Preferably, a shortest distance from the forward end of the stopper member to an inner wall of the cavity portion in a direction of displacing the movable section is not more than a tolerance limit of amplitude of the thin plate sections. In this case, damages of the thin plate section can be prevented effectively since vibration (amplitude) of the thin plate section is not more than a tolerance limit.

The mechanism may have two buffer members formed on the inner wall of the fixing section and a stopper member provided on the inner wall of the movable section, whose forward end enters between the two buffer members. Alternatively, the mechanism may have two buffer members formed on the inner wall of the movable section and a stopper member provided on the inner wall of the fixing section, whose forward end enters between the two buffer members.

In this case, when the forward end of the stopper member hits the buffer member, vibration (amplitude) of the thin plate section is restricted thereby. Further, the appropriately adjusted aspect ratio by height and thickness of the buffer member gives resilience to the buffer member so as to absorb shocks caused when the stopper member hits the buffer member.

Furthermore, the mechanism may have a projecting portion formed from said inner wall of said fixing section into said hole, wherein a shortest distance from said projecting portion to said thin plate section is not more than a tolerance limit of amplitude of said thin plate sections. In this case, damages of the thin plate section can be prevented effectively since vibration (amplitude) of the thin plate section is not more than a tolerance limit. Especially in this arrangement, vibration (amplitude) causing a damage on the thin plate section is restricted effectively when an external force is applied to the thin plate section directly (and intensively), which is effective in preventing the damage on the thin plate section.

The movable section, the fixing section, the thin plate section, and the mechanism can be made of ceramics or metal. That is, each of the components may be made of a ceramic material, or each of them may be made of a metal material. Alternatively, each of the components may be constructed to have a hybrid structure obtained by combining those produced from materials of ceramics and metal.

The thin plate sections, the movable section, the fixing section, and the mechanism may comprise an integrated ceramic substrate formed by simultaneously firing a ceramic green laminate, followed by cutting off unnecessary portions. Further, the piezoelectric/electrostrictive elements may be of a film form and integrated with the ceramic substrate by firing.

Moreover, the piezoelectric/electrostrictive elements may have a piezoelectric/electrostrictive layer and a pair of electrodes formed on the piezoelectric/electrostrictive layer. The piezoelectric/electrostrictive element may have a piezoelectric/electrostrictive layer and a pair of electrodes formed on both sides of the piezoelectric/electrostrictive layer, and one electrode of the pair of electrodes may be formed on at least the thin plate section. In this arrangement, the vibration caused by the piezoelectric/electrostrictive element can be efficiently transmitted via the thin plate section to the movable section or the fixing section. Thus, it is possible to improve the response performance. Further, it is preferable that the piezoelectric/electrostrictive elements are constructed by laminating a plurality of the piezoelectric/electrostrictive layers and the pairs of electrodes.

According to the present invention, a method is provided for producing a piezoelectric/electrostrictive device having a pair of mutually opposing thin plate sections, a movable section, and a fixing section for supporting the thin plate sections and the movable section. The piezoelectric/electrostrictive device includes one or more piezoelectric/electrostrictive elements arranged on at least one thin plate section of the pair of thin plate sections, and a hole formed by both inner walls of the pair of thin plate sections, an inner wall of the movable section, and an inner wall of the fixing section. The method comprises the step of cutting off a predetermined portion, after forming the piezoelectric/electrostrictive elements on at least the thin plate sections, to produce the piezoelectric/electrostrictive device having a mechanism for restricting amplitude of the thin plate sections.

The phrase "after forming the piezoelectric/electrostrictive element" referred to herein indicates a state in which at least the piezoelectric/electrostrictive layer is formed on the thin plate section. As for the electrode to be formed after the formation of the piezoelectric/electrostrictive layer, the electrode may be formed after performing the cutoff on a predetermined portion.

Further, according to the present invention, a method is provided for producing a piezoelectric/electrostrictive device having a pair of mutually opposing thin plate sections, a movable section, and a fixing section for supporting the thin plate sections and the movable section, the piezoelectric/electrostrictive device including one or more piezoelectric/electrostrictive elements arranged on at least one thin plate section of the pair of thin plate sections, and a hole formed by both inner walls of the pair of thin plate sections, an inner wall of the movable section, and an inner wall of the fixing Section. The method comprises the steps of producing a ceramic laminate by firing a ceramic green laminate containing first ceramic green sheets, second ceramic green sheets for constituting a mechanism for restricting amplitude of the thin plate sections and third ceramic green sheets for constituting the thin plate sections integrally, the first ceramic green sheets each having a window for forming at least the hole, forming the piezoelectric/electrostrictive elements on a part of an outer surface of the ceramic laminate for constituting the thin plate sections; and producing a piezoelectric/electrostrictive device having the mechanism for restricting amplitude of the thin plate sections by cutting at least once the ceramic laminate having the piezoelectric/electrostrictive element.

According to the production method, it is possible to obtain a displacement element that is scarcely affected by harmful vibration and capable of high speed response with high mechanical strength while being easy in handling performance, high in shock resistance against the external force, and excellent in moisture resistance without deteriorating the device characteristics such as the displacement characteristic and the response characteristic, as well as a sensor element that makes it possible to accurately detect vibration of the movable section.

In the production methods, the exposure of the hole can be also performed in the cutting step by cutting the ceramic laminate. In this case, the movable section (and/or fixing section) having opposing surfaces, and the hole can be made simultaneously. However, the movable section (and/or fixing section) and the hole can be made separately.

When the cut-off treatment is performed by means of machining, unnecessary vibration is applied. However, the mechanism can restrict the vibration (amplitude) of the thin plate section. Therefore, damages on the thin plate section during the manufacturing processes due to the unnecessary vibration can be prevented effectively, which can improve the productivity of manufacturing the piezoelectric/electrostrictive device.

Therefore, the piezoelectric/electrostrictive device according to the present invention can be utilized as the active device including, for example, various transducers, various actuators, frequency region functional parts (filters), transformers, vibrators, resonators, oscillators, and discriminators for the communication and the power generation, as well as the sensor element for various sensors including, for example, ultrasonic sensors, acceleration sensors, angular velocity sensors, shock sensors, and mass sensors. Especially, the piezoelectric/electrostrictive device according to the present invention can be preferably utilized for various actuators to be used for the mechanism for adjusting the displacement and the positioning and for adjusting the angle for various precision parts such as those of optical instruments and precision mechanical equipments.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 13 illustrates a situation in which both of the piezoelectric/electrostrictive elements do not make the displacement action in the piezoelectric/electrostrictive device according to the first embodiment;

FIG. 14A shows a waveform illustrating a voltage waveform to be applied to one piezoelectric/electrostrictive element;

FIG. 14B shows a waveform illustrating a voltage waveform to be applied to the other piezoelectric/electrostrictive element;

FIG. 26 shows an arrangement of a piezoelectric/electrostrictive device concerning an illustrative conventional technique.

Detailed DESCRIPTION OF THE INVENTION

Explanation will be made below with reference to FIGS. 1 to 25 for illustrative embodiments of the piezoelectric/electrostrictive device and the method of producing the same according to the present invention.

It is noted that the piezoelectric/electrostrictive device resides in a concept which includes the element for mutually converting the electric energy and the mechanical energy by the aid of the piezoelectric/electrostrictive element. Therefore, the piezoelectric/electrostrictive device is most preferably used as the active element such as various actuators and vibrators, especially as the displacement element based on the use of the displacement brought about by the inverse piezoelectric effect or the electrostrictive effect. Additionally, the piezoelectric/electrostrictive device is also preferably used as the passive element such as acceleration sensor elements and shock sensor elements.

The term piezoelectric/electrostrictive means piezoelectric and/or electrostrictive. For example, the terms piezoelectric/electrostrictive device and piezoelectric/electrostrictive element mean a piezoelectric and/or electrostrictive device and a piezoelectric and/or electrostrictive element, respectively.

Figure 1:
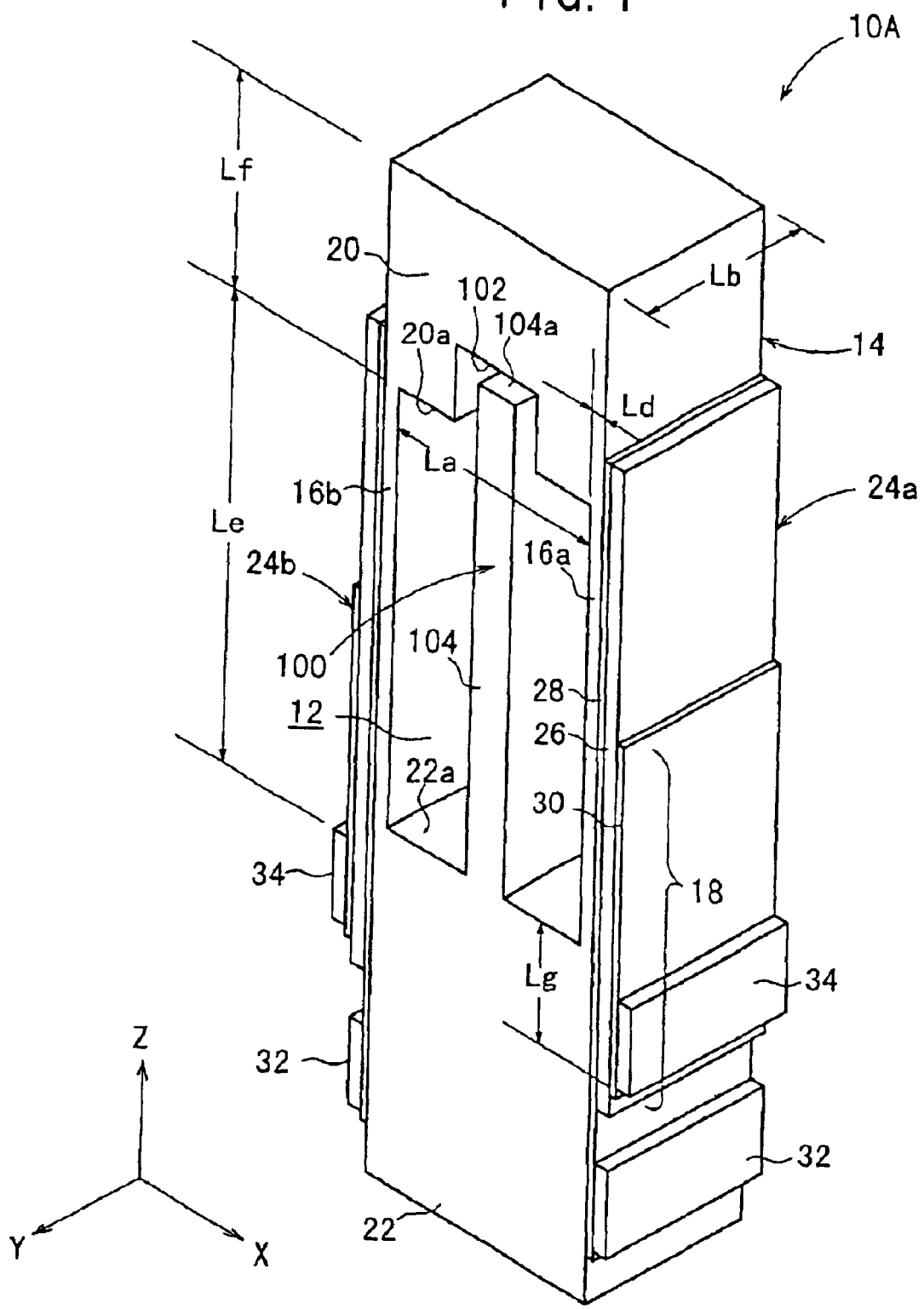
FIG. 1 shows a perspective view illustrating an arrangement of a piezoelectric/electrostrictive device according to a first embodiment.
Figure 2:
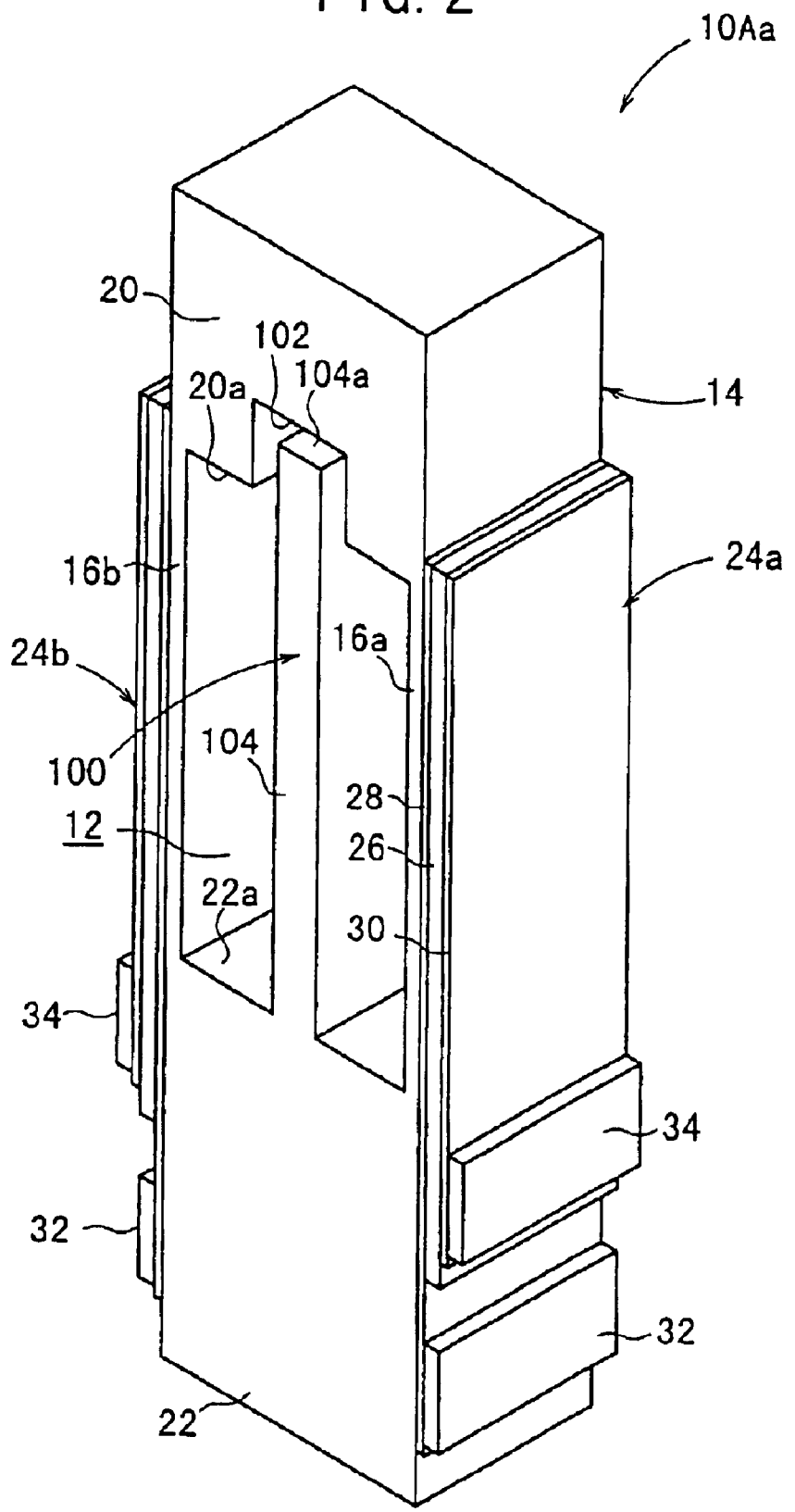
FIG. 2 shows a perspective view illustrating a first modified example of a piezoelectric/electrostrictive device according to the first embodiment.

As shown in FIG. 1, a piezoelectric/electrostrictive device 10A according to a first embodiment has a substrate 14 which has a rectangular parallelepiped-shaped configuration as a whole and which has a hole 12 provided at an approximately central portion in the major axis direction thereof.

The substrate 14 comprises a pair of mutually opposing thin plate sections 16a and 16b, a movable section 20, and a fixing section 22 for supporting the pair of thin plate sections 16a and 16b and the movable section 20, and a piezoelectric/electrostrictive element 24a is formed on at least a part of the thin plate section 16a and a piezoelectric/electrostrictive element 24a is formed at least on a part of the thin plate section 16b. The surfaces of the thin plate sections 16a and 16b where the piezoelectric/electrostrictive elements 24a and 24a are formed are designated as the side surfaces of the thin plate sections 16a and 16b.

Those usable as the substrate 14 include a structure comprising ceramics or metal as a whole, and a hybrid structure obtained by combining products produced with materials of ceramics and a metal.

Those applicable for the substrate 14 include, for example, a structure, in which respective parts are bonded to one another with an adhesive such as organic resin, glass or the like, a ceramic integrated structure which is obtained by firing and integrating a ceramic green laminate into one unit, and a metal integrated structure integrated by brazing, soldering, eutectic bonding, or welding into one unit. Preferably, it is desirable to construct the substrate 14 with a ceramic laminate integrated into one unit by firing a ceramic green laminate.

The time-dependent change of state scarcely occurs in the integrated product of ceramic, because no adhesive exists at joined portions between the respective parts, and therefore, the reliability of the joined portion is high, giving a structure which is advantageous to ensure the rigidity. Additionally, the integrated product of ceramic can be produced with ease by means of laminating ceramic green sheets as described later.

The piezoelectric/electrostrictive elements 24a and 24a are prepared as separate members as described later, and the prepared piezoelectric/electrostrictive elements 24a and 24a are affixed to the substrate 14 with an adhesive, such as organic resin or glass, or by means of brazing, soldering or eutectic bonding. Alternatively, the piezoelectric/electrostrictive elements 24a and 24a are directly fanned on the substrate 14 by using the film formation method not by using the adhesion method described above.

The piezoelectric/electrostrictive device 10A includes the hole 12 having, for example, a rectangular configuration, which is formed by both inner walls of the pair of thin plate sections 16a and 16b, an inner wall 20a of the movable section 20, and an inner wall 22a of the fixing section 22. It is constructed such that the movable section 20 is displaced in accordance with the driving of the piezoelectric/electrostrictive element 24a and/or 24a, or the displacement of the movable section 20 is detected by the piezoelectric/electrostrictive element 24a and/or 24a.

Each of the piezoelectric/electrostrictive elements 24a and 24b comprises a piezoelectric/electrostrictive layer 26, and a pair of electrodes 28 and 30 formed on both sides of the piezoelectric/electrostrictive layer 26. A first electrode 28 of the pair of electrodes 28 and 30 is formed at least on each of the pair of thin plate sections 16a and 16b.

In the embodiment shown in FIG. 1, respective forward ends of the first electrode 28 and the piezoelectric/electrostrictive layer 26 constructing the piezoelectric/electrostrictive elements 24a and 24b are extended to the side surface of the movable section 20 so that a forward end of the second electrode 30 is located substantially at the center with respect to the length direction (Z-axis direction) of the thin plate sections 16a and 16b. A substantial driving portion 18 of each of the piezoelectric/electrostrictive elements 24a and 24b (portion at which the pair of electrodes 28 and 30 are overlapped with each other with the piezoelectric/electrostrictive layer 26 interposed therebetween) is continuously formed over a range from a part of the side surface of the fixing section 22 to a part of the side surface of each of the thin plate sections 16a and 16b. Thus, a displacement amount of the movable section 20 can be increased efficiently.

The piezoelectric/electrostrictive device 10A according to the first embodiment has a mechanism 100 for restricting amplitude of the thin plate sections 16a and 6b and the movable section 20 as shown in FIG. 1. The mechanism 100 includes a cavity portion 102 formed on the inner wall 20a of the movable section 20 and a plate-like stopper member 104 provided on the inner wall 22a of the fixing section 22, whose forward end 104a enters the cavity portion 102.

In this case, as shown in FIG. 13, for example, a shortest distance Lc from the forward end 104a of the stopper member 104 to an inner wall (side wall) 102a of the cavity portion 102 in a direction of displacing the movable section 20 is not more than a tolerance limit of amplitude of the movable section 20 and the thin plate sections 16a and 16b. Thus, damages of the thin plate sections can be prevented effectively since vibration (amplitude) of the movable section 20 and thin plate sections 16a and 16b is not more than a tolerance limit. Further, if a shortest distance from the forward end 104a of the stopper member 104 to the inner wall 102a of the cavity portion 102 in a direction along which the stopper member 104 extends is formed in a predetermined size in accordance with the tolerance limit, damages of the thin plate sections 16a and 16b caused by the external force from the Z-axis direction can be prevented effectively.

The voltage is applied to the pair of electrodes 28 and 30 via terminals (pads) 32 and 34 of the respective electrodes 28 and 30 formed on both side surfaces (element formation surfaces) of the fixing section 22, respectively. The respective terminals 32 and 34 are positioned in such a manner that the terminal 32 corresponding to the first electrode 28 is formed at the position deviated toward the rearward end of the fixing section 22, and the terminal 34 corresponding to the second electrode 30 disposed on the side of the external space is formed at the position deviated toward the inner wall 22a of the fixing section 22.

In this case, the piezoelectric/electrostrictive device 10A can be individually fixed by utilizing the surfaces, on which the terminals 32 and 34 are not arranged, and as a result, it is possible to obtain the high reliability for both of the fixing of the piezoelectric/electrostrictive device 10A and the electric connection between the circuit and the terminals 32 and 34. In this arrangement, the electric connection between the circuit and the terminals 32 and 34 is made, for example, by means of the flexible printed circuit (also referred to as FPC), the flexible flat cable (also referred to as FFC), and the wire bonding.

Structures other than the structure shown in FIG. 1 are available for the piezoelectric/electrostrictive elements 24a and 24b. That is, in a piezoelectric/electrostrictive device 10Aa according to a first modified example shown in FIG. 2, it is also preferable that the respective forward ends of the pair of electrodes 28 and 30 and piezoelectric/ electrostrictive layer 26 are substantially aligned. A substantial driving portion 18 of each of the piezoelectric/ electrostrictive elements 24a and 24b (portion at which the pair of electrodes 28 and 30 are overlapped with each other with the piezoelectric/electrostrictive layer 26 interposed therebetween) is continuously formed over a range from a part of the side surface of the fixing section 22 to a part of the side surface of the movable section 20.

Figure 3:
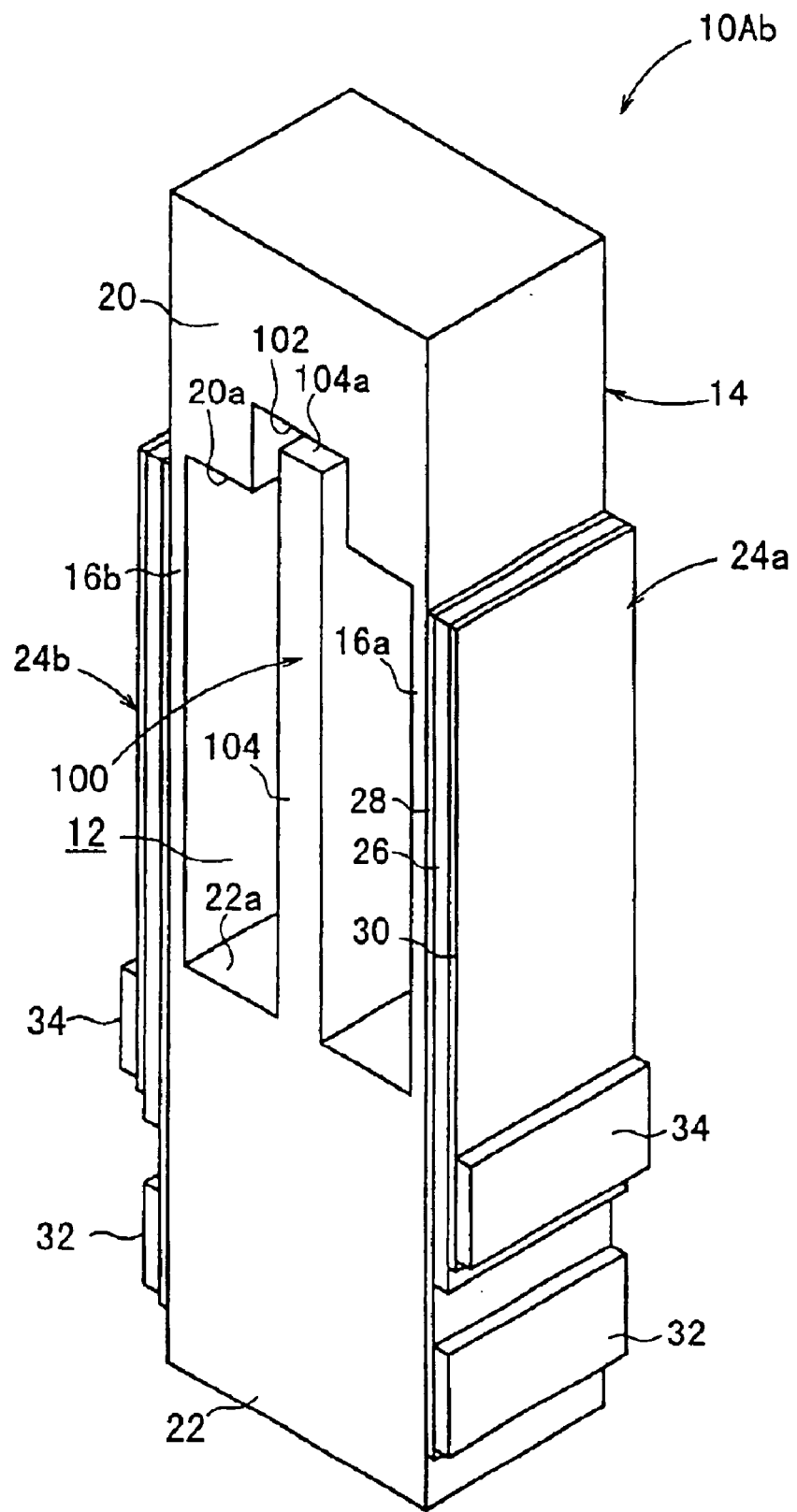
FIG. 3 shows a perspective view illustrating a second modified example of a piezoelectric/electrostrictive device according to the first embodiment.

Further, in the piezoelectric/electrostrictive device 10Ab according to a second modified example shown in FIG. 3, it is preferable that respective forward end surfaces of the pair of electrodes 28 and 30 and the piezoelectric/electrostrictive layer 26 are substantially aligned, and a substantial driving portion 18 of each of the piezoelectric/electrostrictive elements 24a and 24b is continuously formed over a range from a part of the outer circumferential surface of the fixing section 22 to a part of the side surface of each of the thin plate sections 16a and 16b. Alternatively, as in the piezoelectric/electrostrictive device 10Ac according to a third modified example shown in FIG. 4, it is also preferable that the respective forward ends of the first and second electrodes 28 and 30 constructing the piezoelectric/ electrostrictive elements 24a and 24b are aligned, and only the forward end of the piezoelectric/electrostrictive layer 26 is projected toward the movable section 20. In the case of the structure having the arrangement of the piezoelectric/ electrostrictive elements 24a and 24b as shown in FIGS. 3 and 4, in the same way as in the example shown in FIG. 1, the movable section 20 can be displaced greatly in parallel with the fixing section 22.

Figure 4:
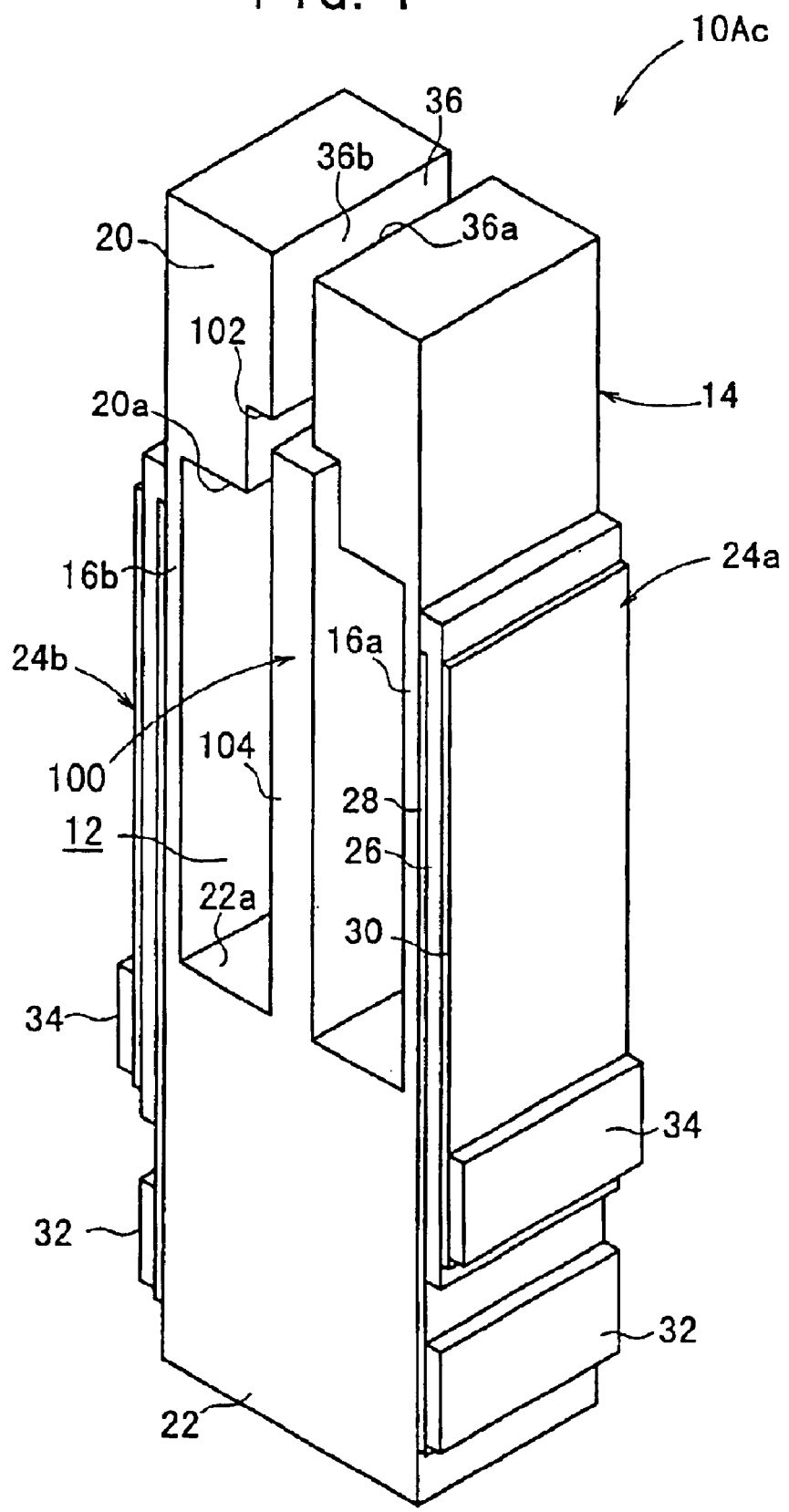
FIG. 4 shows a perspective view illustrating a third modified example of a piezoelectric/electrostrictive device according to the first embodiment.
Figure 5:
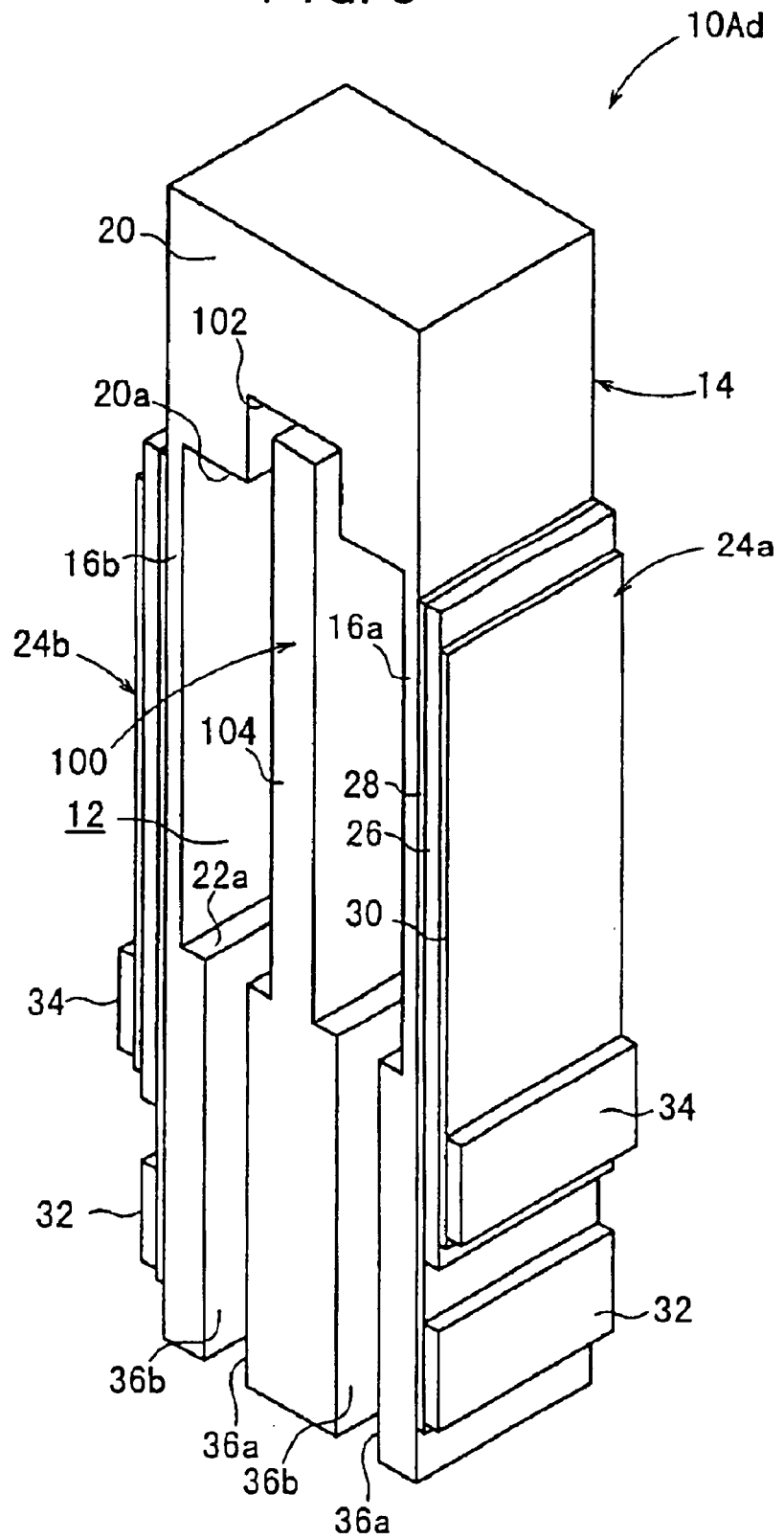
FIG. 5 shows a perspective view illustrating a fourth modified example of a piezoelectric/electrostrictive device according to the first embodiment.

Especially, in a piezoelectric/electrostrictive device 10Ac according to the third modified example shown in FIG. 4, the movable section 20 is provided with mutually opposing end surfaces 36a and 36b.

In this arrangement, because the internal residual stress generated in the piezoelectric/electrostrictive elements 24a and 24b and/or the thin plate sections 16a and 16b at the time of manufacturing process can be released by the movement of the end surfaces 36a and 36b, the displacement operation of the movable section 20 is not inhibited by the internal residual stress, and it is possible to achieve the displacement operation of the movable section 20 substantially as designed. Additionally, the release of the stress improves the mechanical strength of the piezoelectric/electrostrictive device 10Ac.

Between the end surfaces 36a and 36b, a gap (air) 38 may intervene as shown in FIG. 4, or in alternative, a material different from the constitutional material of the movable section 20, such as a resin, may be interposed between the end surfaces. While the foregoing example where the end surfaces 36a and 36b mutually opposing one another are provided in the movable section 20 is described, the end surfaces 36a and 36b may be formed in the fixing section 22 as the piezoelectric/electrostrictive device 10Ad according to the fourth modified example shown in FIG. 5. Also in the arrangement of the piezoelectric/electrostrictive elements 24a and 24a shown in FIG. 5, the movable section 20 can be displaced greatly in parallel with the fixing section 22.

While each of the piezoelectric/electrostrictive elements 24a and 24b is constituted with the piezoelectric/ electrostrictive layer 26 of a one-layer structure and the pair of electrodes 28 and 30 in the foregoing examples, it is also preferred that each of the piezoelectric/electrostrictive elements 24a and 24b is constituted by laminating a plurality of the piezoelectric/electrostrictive layers 26 and pairs of electrodes 28 and 30.

Figure 6:
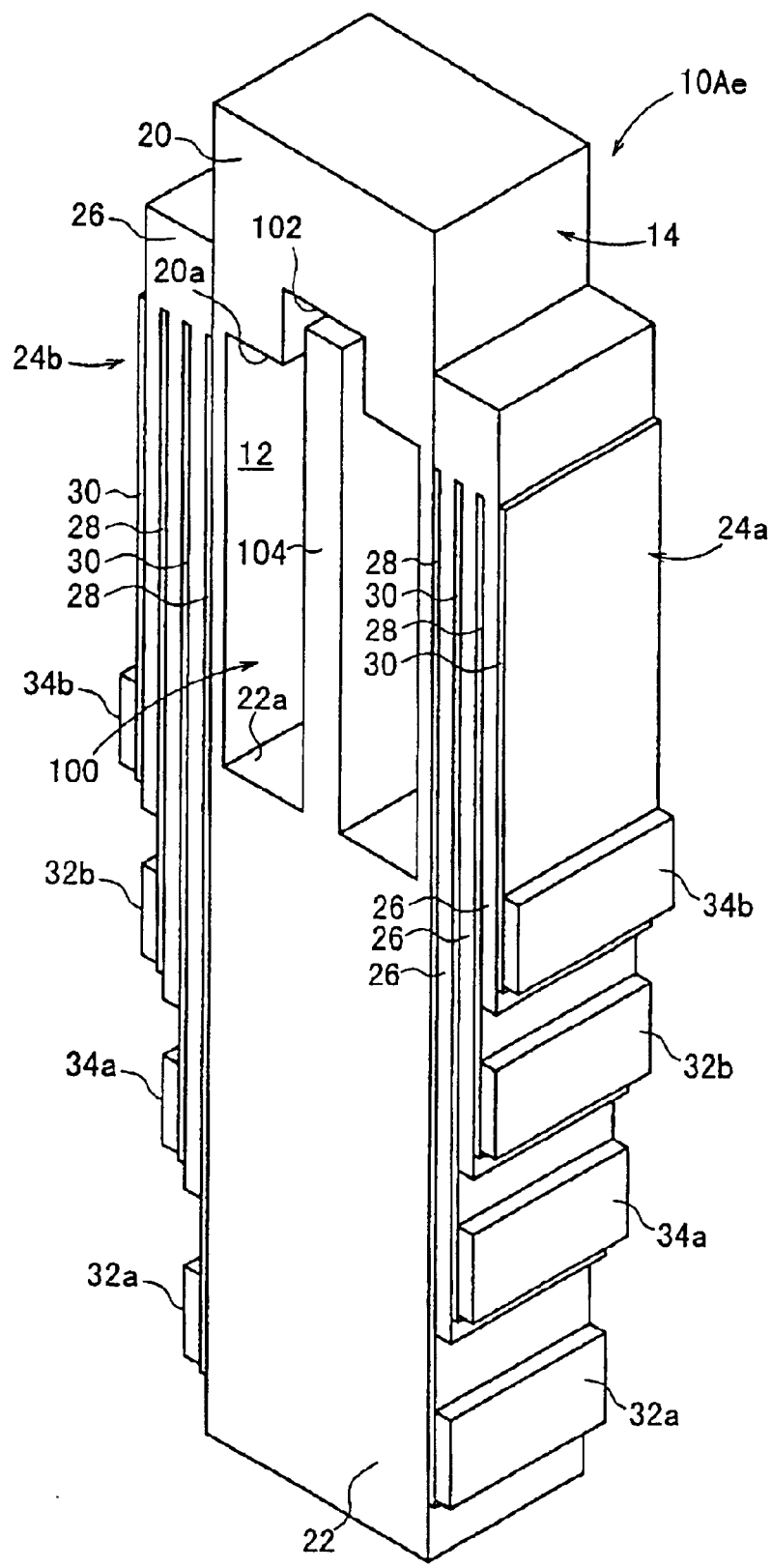
FIG. 6 shows a perspective view illustrating a fifth modified example of a piezoelectric/electrostrictive device according to the first embodiment.

For example, in the piezoelectric/electrostrictive device 10Ae according to the fifth modified example shown in FIG. 6, the piezoelectric/electrostrictive layers 26 and pairs of electrodes 28 and 30 forms a multi-layer structure, in which the first electrodes 28 and the second electrodes 30 are alternately stacked with one other to provide the piezoelectric/electrostrictive elements 24a and 24a each having a multiple stage structure at a portion (substantial driving portion 18) at which the first electrodes 28 and the second electrodes 30 are overlapped with each other with the piezoelectric/electrostrictive layer 26 interposed therebetween. In FIG. 6, the piezoelectric/electrostrictive layer 26 has a three-layer structure, in which the first electrode 28 is formed separately on the lower surface of the first layer (side surface of the thin plate section 16*a* or 16*b*) and the upper surface of the second layer, and the second electrode 30 is formed separately on the upper surface of the first layer and the upper surface of the third layer. Furthermore, the terminals 32*a* and 32*b* are formed at the both ends of the electrode 28, respectively, and the terminals 34*a* and 34*a* are formed at both ends of the second electrode 30, respectively.

Figure 7:
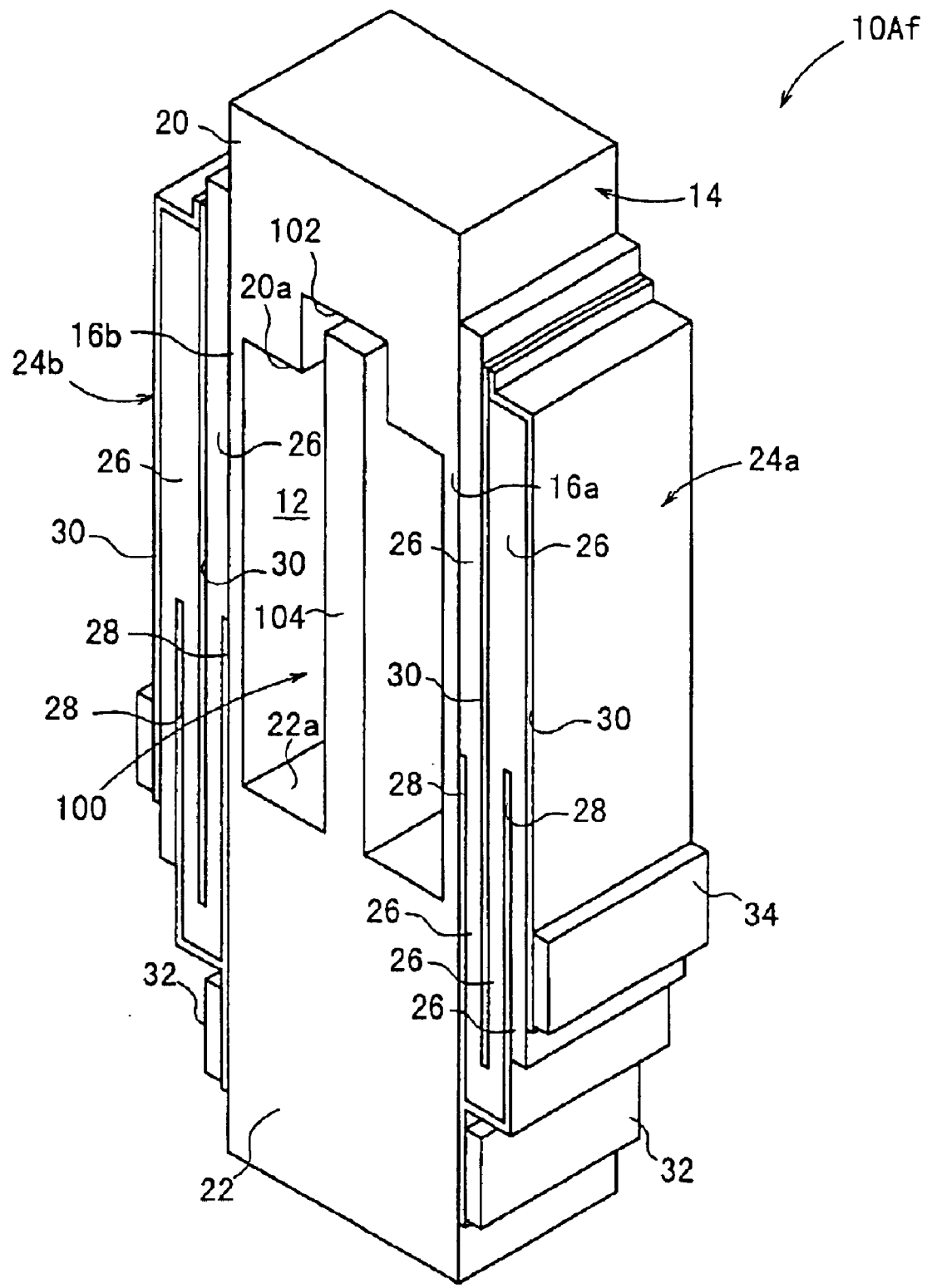
FIG. 7 shows a perspective view illustrating a sixth modified example of a piezoelectric/electrostrictive device according to the first embodiment.

In the piezoelectric/electrostrictive device 10Af according to the sixth modified example shown in FIG. 7, the piezoelectric/electrostrictive layer 26 and pair of the electrodes 28 and 30 form a multi-layer structure, in which the first electrode 28 and the second electrode 30 are laminated alternately to have a cross section like a comb teeth, thereby to provide the piezoelectric/electrostrictive elements 24*a* and 24*a* each having a multiple stage structure at a portion (substantial driving portion 18) at which the first electrodes 28 and the second electrodes 30 are overlapped with each other with the piezoelectric/electrostrictive layer 26 interposed therebetween. In FIG. 7, the piezoelectric/electrostrictive layer 26 has a three-layer structure. The first electrode 28 has a cross section like a comb teeth, such that the first electrode 28 is positioned on the lower surface of the first layer (side surface of the thin plate section 16*a* or 16*b*) and the upper surface of the second layer, and the second electrode 30 has a cross section like a comb teeth, such that the second electrode 30 is positioned on the upper surface of the first layer and the upper surface of the third layer. In this arrangement, the first electrodes 28 are connected to one other to be used commonly, and the second electrodes 30 are connected to one other to be used commonly, so as to decrease the numbers of the terminals 32 and 34 in comparison to the arrangement of FIG. 6. With the multi-layer structure of the piezoelectric/electrostrictive elements 24*a* and 24*a*, the increase in size can be suppressed.

In FIG. 6, a signal of the same potential can be applied to the first electrodes 28 and the second electrodes 30, respectively. Further, independent signals can be applied to all the electrodes 28 and 30. In the latter case, different amount of distortion can be formed in respective piezoelectric/electrostrictive layers 26 to make it possible to conduct more precise displacement control.

Figure 8:
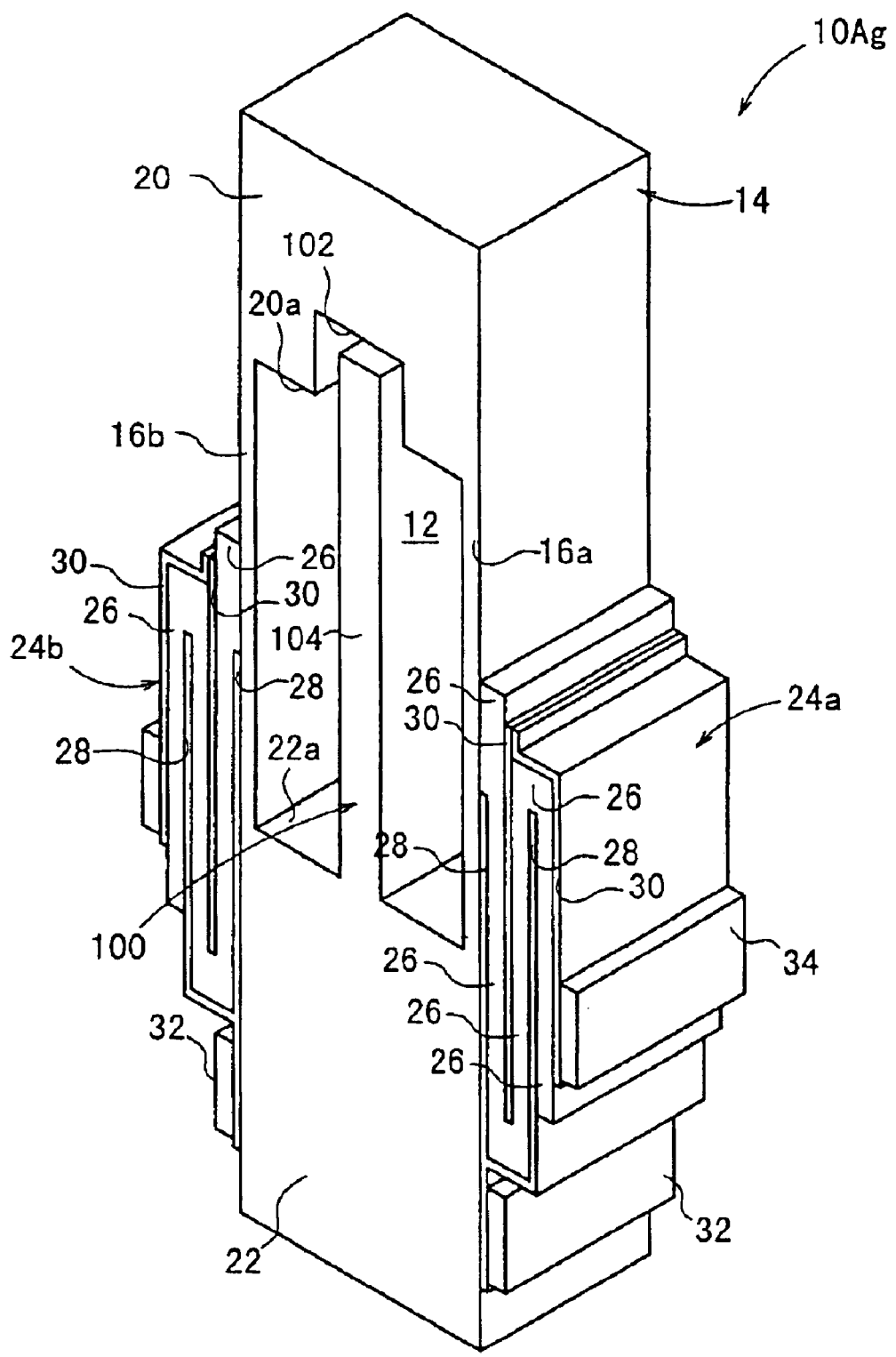
FIG. 8 shows a perspective view illustrating a seventh modified example of a piezoelectric/electrostrictive device according to the first embodiment.

In the piezoelectric/electrostrictive device 10Ag according to the seventh modified example shown in FIG. 8, the piezoelectric/electrostrictive elements 24*a* and 24*b* are formed in such a manner that the forward ends thereof stay on the thin plate sections 16*a* and 16*b*. The example in FIG. 8 illustrates that the forward ends of the piezoelectric/electrostrictive elements 24*a* and 24*b* are positioned at the substantially central part with respect to the longitudinal direction of the thin plate sections 16*a* and 16*b*. In this arrangement, the movable section 20 can be advantageously subjected to large displacement substantially in parallel to the fixing section 22.

Figure 9:
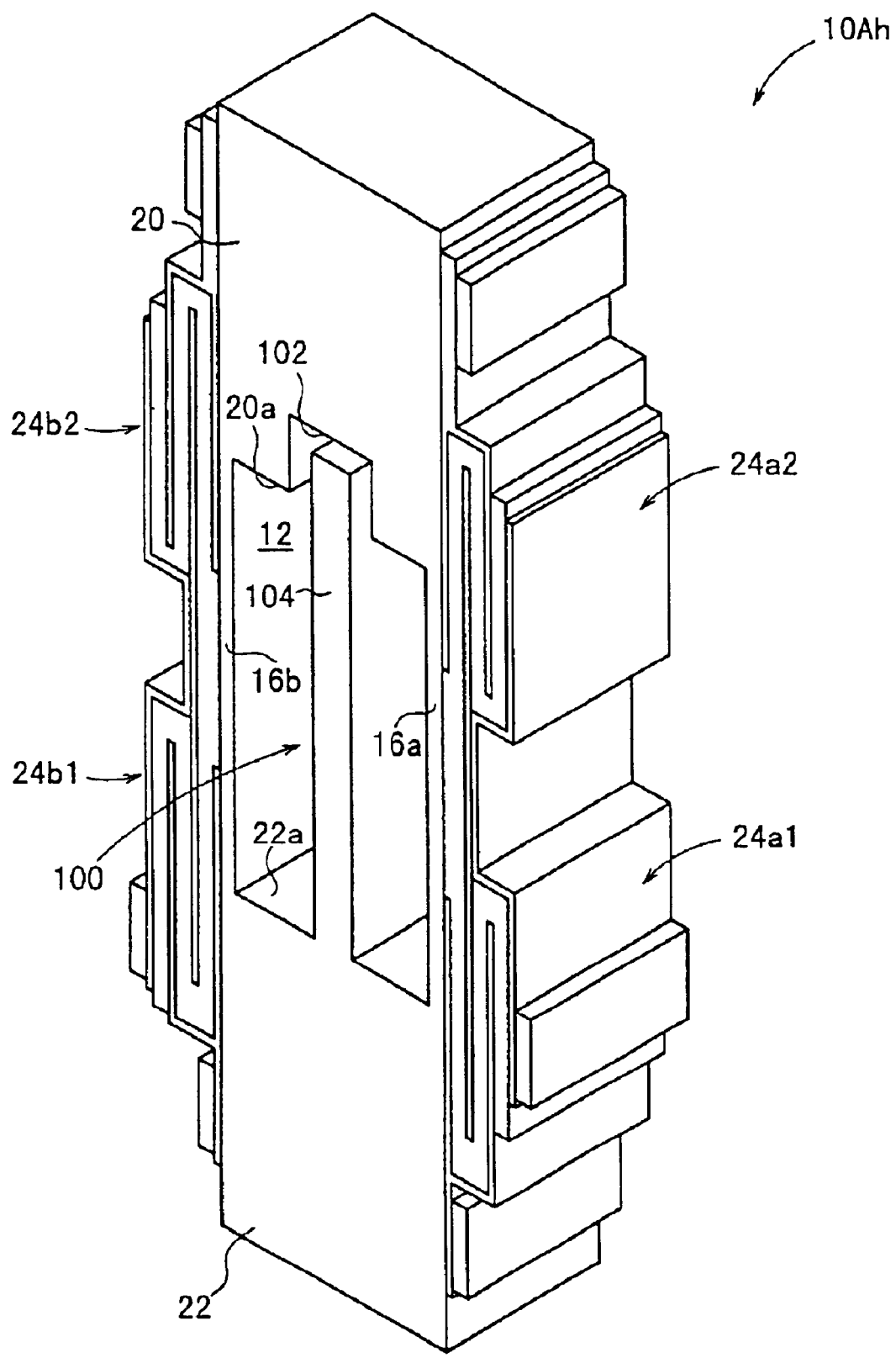
FIG. 9 shows a perspective view illustrating an eighth modified example of a piezoelectric/electrostrictive device according to the first embodiment.

In the piezoelectric/electrostrictive device 10Ah according to the eighth modified example shown in FIG. 9, two piezoelectric/electrostrictive elements 24*a*1 and 24*b*1 each having a multi-step structure are formed over the fixing section 22 and the thin plate sections 16*a* and 16*b*, respectively, and other two piezoelectric/electrostrictive elements 24*a*2 and 24*b*2 each having the multi-step structure are formed over the movable section 20 and the thin plate sections 16*a* and 16*b*, respectively. This arrangement is preferred since the movable section 20 can be subjected to remarkably large displacement, and the device is excellent in high speed response by the effect of making the piezoelectric/electrostrictive elements 24*a* and 24*b* to have the multiple stage structure and the effect of increasing the sites of action to displace the movable section 20.

Figure 10:
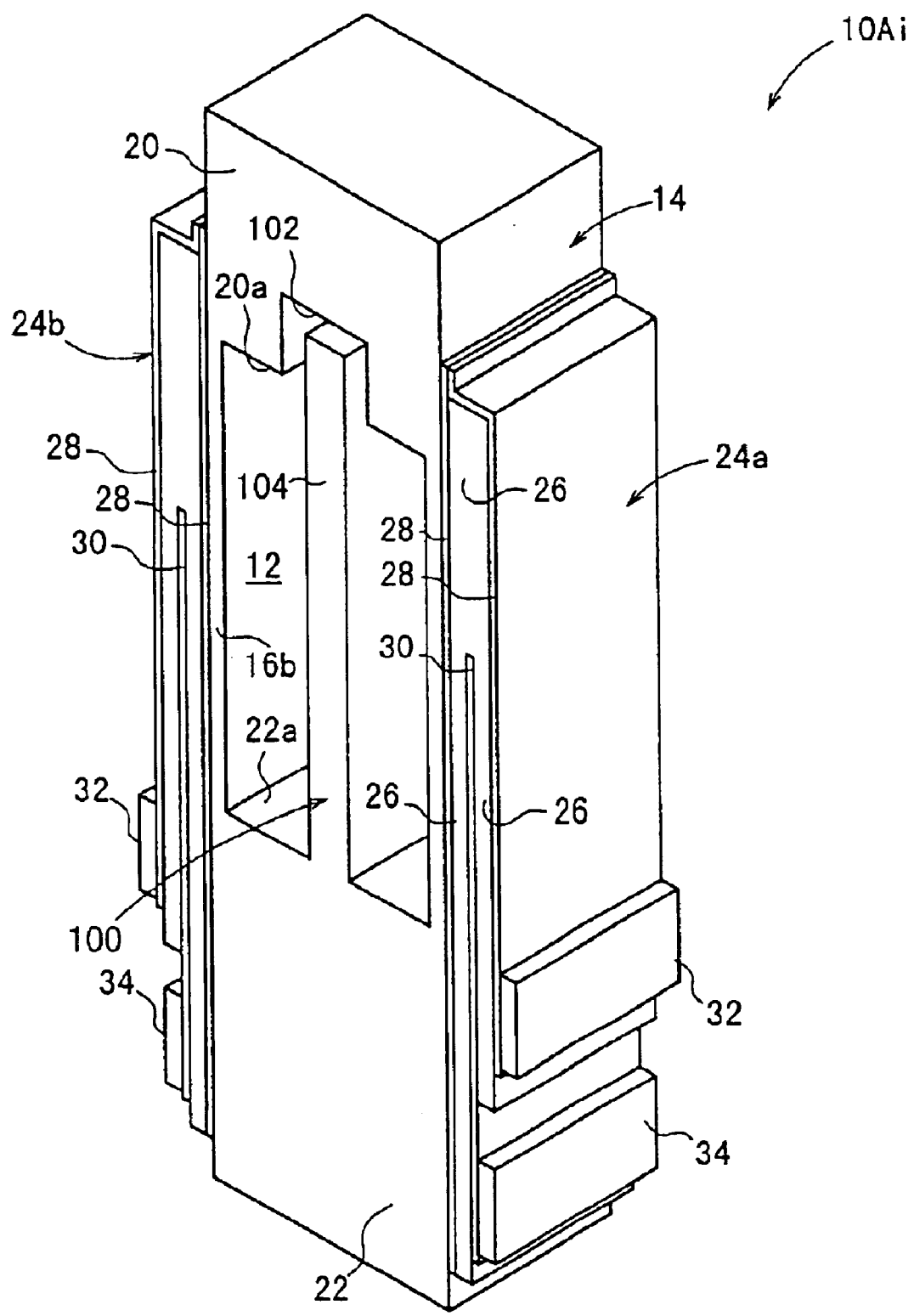
FIG. 10 shows a perspective view illustrating a ninth modified example of a piezoelectric/electrostrictive device according to the first embodiment.

According to the piezoelectric/electrostrictive device 10Ai of the ninth modified example, as shown in FIG. 10, the piezoelectric/electrostrictive elements 24*a* and 24*b* are constructed such that the piezoelectric/electrostrictive layers 26 constitute a two-layer structure, and the electrodes 28 are configured like comb teeth. The electrode 28 is positioned on each of the lower surface of the first layer (side surface of the thin plate section 16*a* or 16*b*) and the upper surface of the second layer, with the second electrode 30 being formed on the upper surface of the first layer.

With the multiple stage structure of the piezoelectric/electrostrictive elements 24*a* and 24*b*, the force generated by the piezoelectric/electrostrictive elements 24*a* and 24*b* is increased to realize large displacement. Further, thanks to the increased rigidity of the piezoelectric/electrostrictive device 10Ai, the resonance frequency is increased, with the result that the high speed displacement operation can be easily realized.

The term frequency herein means the frequency of the voltage wave form when the voltage applied to the pair of electrodes 28 and 30 is changed alternately to make horizontal displacement of the movable section 20 from side to side, and the term resonance frequency herein means the maximum frequency where the movable section 20 can follow in the predetermined vibration mode.

Though more driving force can be obtained by increasing the number of steps, the electric power consumption also increases accordingly. Therefore, in an actual application, the number of the stages may be appropriately determined depending on the application and the condition in use. Furthermore, in the piezoelectric/electrostrictive devices 10Ae to 10Ai according to the fifth to ninth modified examples, even though the piezoelectric/electrostrictive elements 24*a* and 24*b* have the multiple stage structure, the width (length in the Y axis direction) of the thin plate sections 16*a* and 16*b* is not changed. Therefore, the device is suitable for an actuator used for positioning and the ringing control of magnetic head of a hard disk drive in an extremely narrow space, for example.

Figure 11:
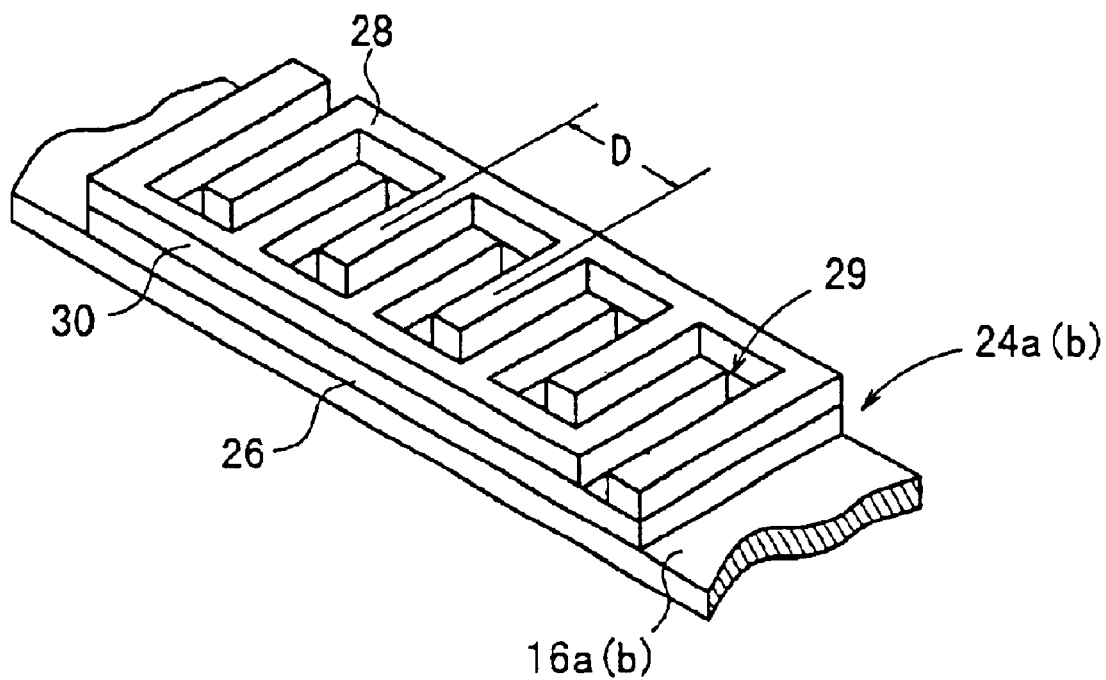
FIG. 11 shows, with partial omission, another example of the piezoelectric/electrostrictive element.

While the above described examples of the piezoelectric/electrostrictive elements 24*a* and 24*b* are constituted by the so-called sandwich structure where the piezoelectric/electrostrictive layer 26 is interposed between the pair of electrodes 28 and 30, the pair of electrodes 28 and 30 having a comb form may be formed on one major surface of the piezoelectric/electrostrictive layer 26 formed on the side surfaces of the thin plate sections 16*a* and 16*b* as shown in FIG. 11. Alternatively, the pair of the electrodes 28 and 30 having a comb form may be embedded in the piezoelectric/electrostrictive layer 26 on the side surfaces of the thin plate sections 16*a* and 16*b* as shown in FIG. 12.

Figure 12:
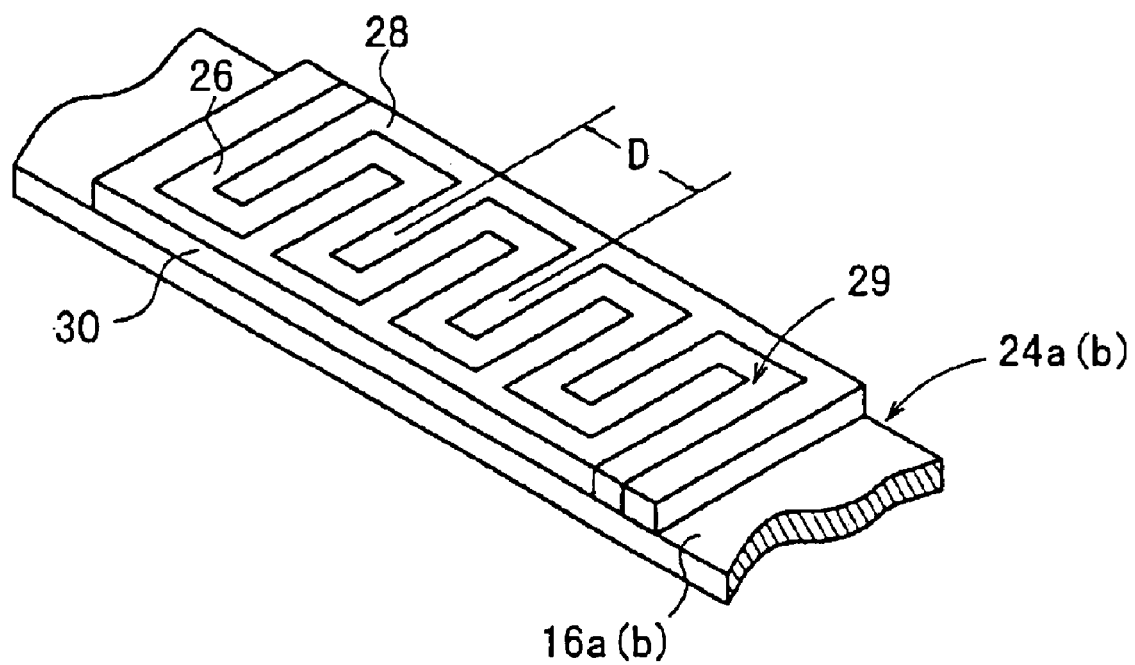
FIG. 12 shows, with partial omission, still another example of the piezoelectric/electrostrictive element.

In the case of the structure shown in FIG. 11, there is an advantage in that the electric power consumption can be suppressed to small, and in the case of the structure shown in FIG. 12, the inverse piezoelectric effect or the electrostrictive effect in the direction of the electric field that has large generating force and distortion can be effectively utilized, and therefore it is advantageous to generate large displacement.

Specifically, the piezoelectric/electrostrictive elements 24a and 24b shown in FIG. 11 comprise the pair of electrodes 28 and 30 having the comb structure formed on one major surface of the piezoelectric/electrostrictive layer 26, and have such a structure that the first electrode 28 and the second electrode 30 mutually oppose one another with a gap 29 having a constant width. While an example where the pair of electrodes 28 and 30 are formed on one major surface of the piezoelectric/electrostrictive layer 26 is shown in FIG. 11, the pair of electrodes 28 and 30 may be formed between the thin plate sections 16a and 16b and the piezoelectric/electrostrictive layer 26, or in alternative, the pair of electrodes 28 and 30 having the comb form is respectively formed on the major surface of the piezoelectric/electrostrictive layer 26 and between the thin plate sections 16a and 16b and the piezoelectric/electrostrictive layer 26.

On the other hand, the piezoelectric/electrostrictive elements 24a and 24b shown in FIG. 12 comprise the pair of electrodes 28 and 30 having the comb form buried in the piezoelectric/electrostrictive layer 26, and have such a structure that the first electrode 28 and the second electrode 30 mutually oppose one another with a gap 29 having a constant width.

The piezoelectric/electrostrictive elements 24a and 24b shown in FIG. 11 and FIG. 12 can also be suitably used in the piezoelectric/electrostrictive device 10A according to the first embodiment and the like. In the case where the pair of electrodes 28 and 30 having the comb form as in the piezoelectric/electrostrictive elements 24a and 24b as shown in FIG. 11 and FIG. 12, the displacement of the piezoelectric/electrostrictive elements 24a and 24b can be increased by reducing the pitch D of the comb teeth of the respective electrodes 28 and 30.

The operation of the piezoelectric/electrostrictive device 10A according to the first embodiment will be described below. In the case where the two piezoelectric/electrostrictive elements 24a and 24a are in the natural state, i.e., both the piezoelectric/electrostrictive elements 24a and 24a do not conduct displacement operation, the major axis m of the piezoelectric/electrostrictive device 10A (major axis of the fixing section) is substantially coaxially aligned with the central axis n of the movable section 20 as shown in FIG. 13.

From that state, a sine wave Wa having a predetermined bias voltage Vb is applied to the pair of electrodes 28 and 30 of one piezoelectric/electrostrictive element 24a as shown in FIG. 14A, and a sine wave Wb having a phase that is different from the sine wave Wa by about 180° is applied to the pair of electrodes 28 and 30 of the other piezoelectric/electrostrictive element 24b as shown in FIG. 14B.

Figure 15:
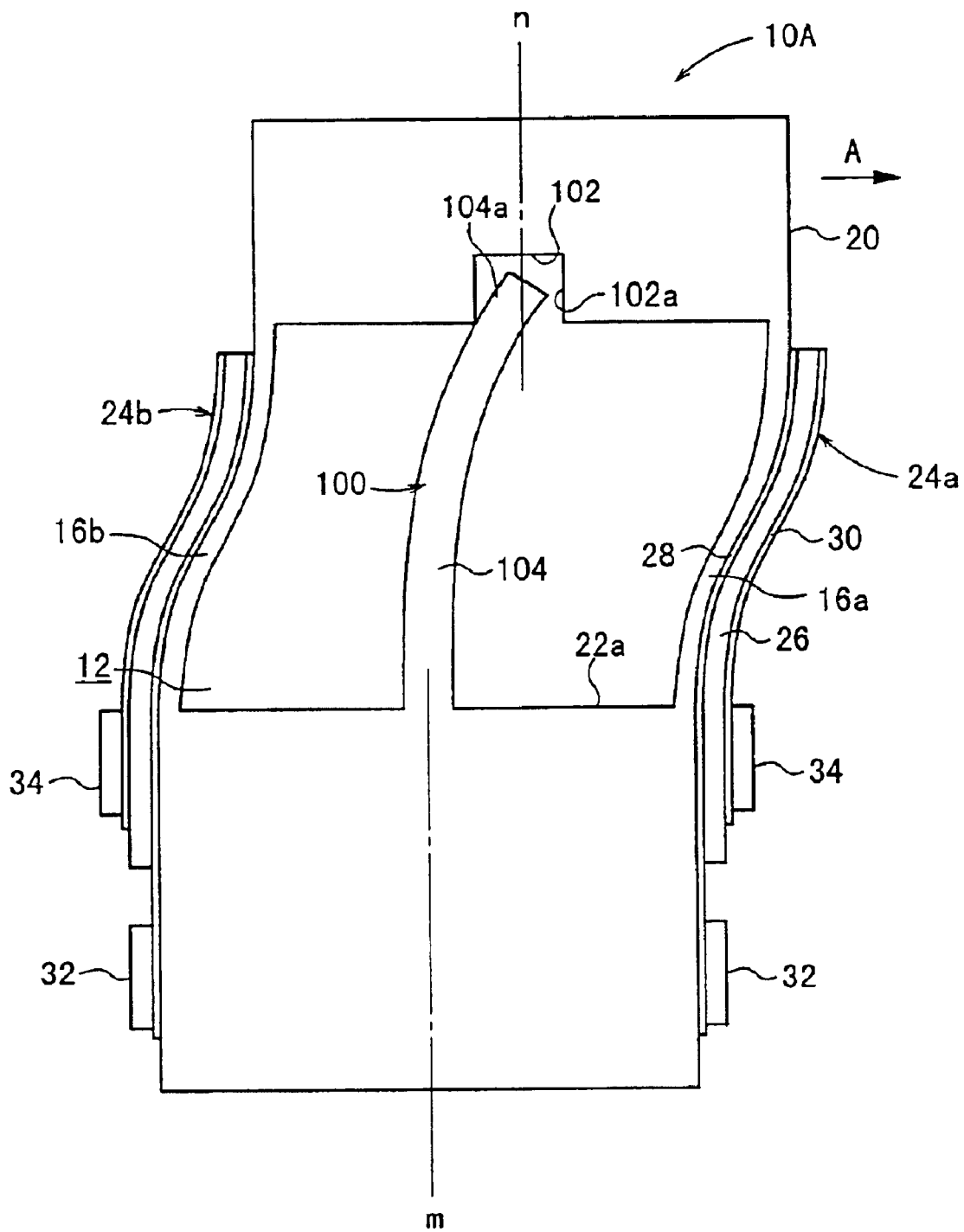
FIG. 15 illustrates a situation, in which the piezoelectric/electrostrictive element makes the displacement action in the piezoelectric/electrostrictive device according to the first embodiment.

At the step where the maximum voltage is applied to the pair of electrodes 28 and 30 of one piezoelectric/electrostrictive element 24a, the piezoelectric/electrostrictive layer 26 of the one piezoelectric/electrostrictive element 24a suffers contractive displacement in the major surface direction. Accordingly, as shown in FIG. 15, a stress in such a direction that bends the thin plate section 16a, for example, in the right direction as shown by the arrow A is applied to the thin plate section 16a, and thus the thin plate section 16a is bent in the right direction. At this time, the pair of electrodes 28 and 30 of the other piezoelectric/electrostrictive element 24b is in the state where no voltage is applied thereto, and the other thin plate section 16b is bent in the right direction following the bending of the thin plate section 16a.

As a result, the movable section 20 is displaced, for example, in the right direction with respect to the major axis m of the piezoelectric/electrostrictive device 10A. The displacement amount varies depending on the maximum value of the voltage applied to the respective piezoelectric/electrostrictive elements 24a and 24b, and for example, when the maximum value is increased, the displacement amount is also Increased.

In this embodiment, when the movable section 20 is displaced, a forward end 104a of a stopper member 104 is arranged to hit a side wall 102a of a cavity portion 102 provided on an inner wall 20a of the movable section 20 to suppress the displacement of the movable section 20. Thus, when the external force or the like is applied to the movable section 20, which causes its large vibration (amplitude), the action of the mechanism 100 (the forward end 104a of the stopper member 104 hits the side wall 102a of the cavity portion 102) can restrict the vibration (amplitude) of the movable section 20. As a result, it can prevent the thin plate sections 16a and 16b from being damaged. In this case, the thin plate sections 16a and 16b not need to be thickened for preventing such damages. Therefore, material characteristics of the piezoelectric/electrostrictive elements 24a and 24b provided on the thin plate sections 16a and 16b are not deteriorated, which does not deteriorate device characteristics such as the displacement characteristic and the response characteristic.

Particularly, in the case where a piezoelectric/electrostrictive material having a coercive electric field is applied to the material constituting the piezoelectric/electrostrictive layer 26, it is possible that the bias voltage Vb is so adjusted that the level of the minimum value is a slightly negative level as shown in the two-dot chain lines in FIG. 14A and FIG. 14B. In this case, according to the drive of the piezoelectric/electrostrictive element, to which the negative level is applied (for example, the other piezoelectric/electrostrictive element 24b), a stress in the direction of bending of the one thin plate section 16a is generated in the other thin plate section 16b, whereby it becomes possible to increase the displacement amount of the movable section 20. That is, by using the wave form shown by the two-dot chain lines in FIG. 14A and FIG. 14B, the piezoelectric/electrostrictive element 24a or 24b, to which the negative level is applied, advantageously supports the piezoelectric/electrostrictive elements 24a or 24b mainly conducting the displacement operation.

In the piezoelectric/electrostrictive device 10Ah according to the eighth modified example shown in FIG. 9, the voltage shown in FIG. 14A (see the sine wave Wa) is applied, for example, to the diagonally arranged piezoelectric/electrostrictive element 24a1 and the piezoelectric/electrostrictive element 24b2, and the voltage shown in FIG. 14B (see the sine wave Wb) is applied to the other piezoelectric/electrostrictive element 24a2 and the piezoelectric/electrostrictive element 24b1.

Therefore, in the piezoelectric/electrostrictive device 10A according to the first embodiment and the piezoelectric/electrostrictive devices 10Aa to 10Aj according to the modified examples, the minute displacement of the piezoelectric/electrostrictive elements 24a and 24b is amplified to large displacement operation by utilizing the bending of the thin plate sections 16a and 16b and is transferred to the movable section 20, and thus the movable section 20 can be subjected to large displacement with respect to the major axis m of the piezoelectric/electrostrictive device 10A.

Especially, the mechanism 100 is provided for restricting the amplitude of the movable section 20 and the thin plate sections 16a and 16b. Thus, when the external force is applied to the movable section 20 and the thin plate sections 16a and 16b, which causes their large vibration (amplitude), the mechanism 100 can restrict the vibration (amplitude) of the movable section 20 and the thin plate sections 16a and 16b. As a result, it can prevent the thin plate sections from being damaged. In this case, the thin plate sections 16a and 16b not need to be thickened. Therefore, material characteristics of the piezoelectric/electrostrictive elements 24a and 24b provided on the thin plate sections 16a and 16b are not deteriorated, which does not deteriorate device characteristics such as the displacement characteristic and the response characteristic.

Accordingly, in the first embodiment, the high-speed response is possible without deteriorating the device characteristics such as the displacement characteristic and the response characteristic.

In the piezoelectric/electrostrictive device 10A according to the first embodiment, since the movable section 20, the thin plate sections 16a and 16b and the fixing section 22 are integrated, and all of the components are not necessarily formed with the relatively heavy piezoelectric/electrostrictive material, high mechanical strength and excellence in handling performance, shock resistance, and moisture resistance can be obtained without being subjected to the influence of harmful vibration (for example, residual vibration and noise vibration on high speed operation) during operation.

In the piezoelectric/electrostrictive device 10A according to the first embodiment, the piezoelectric/electrostrictive elements 24a and 24b are constituted to have the piezoelectric/electrostrictive layer 26 and the pair of electrodes 28 and 30 formed on both sides of the piezoelectric/electrostrictive layer 26, and the first electrode 28 of the pair of the electrodes 28 and 30 is formed on at least the outer surface of the thin plate sections 16a and 16b, whereby the vibration caused by the piezoelectric/electrostrictive elements 24a and 24b can be effectively transmitted to the movable section 20 via the thin plate sections 16a and 16b, so as to improve the response performance.

Particularly, in the piezoelectric/electrostrictive device 10A according to the first embodiment, the piezoelectric/electrostrictive devices 10Ab to 10Ag according to the second to seventh modified examples, and the piezoelectric/electrostrictive device 10Ai according to the ninth modified embodiment, the part of the piezoelectric/electrostrictive layer 26 sandwiched by the pair of electrodes 28 and 30 (substantial driving portion 18) is continuously formed from a part of the fixing section 22 to a part of the thin plate sections 16a and 16b.

In the case where the substantial driving portion 18 is formed further to a part of the movable section 20, there is a possibility that the displacement operation of the movable section 20 is restricted by the substantial driving portion 18 to fail to obtain large displacement, but in this embodiment, because the substantial driving portion 18 is formed not over both the movable section 20 and the fixing section 22, the displacement amount of the movable section 20 can be made large.

In particular, it is preferable to employ the constitutions of the second, third, fourth and seventh piezoelectric/electrostrictive devices 10Ab, 10Ac, 10Ad and 10Ag, since the movable section 20 can be displaced substantially in parallel to the fixing section 22, with the result that the damages on the thin plate sections 16a and 16b are suppressed because of the increase in shock resistance against the external force.

On the other hand, in the case where the piezoelectric/electrostrictive elements 24a and 24b are formed on a part of the movable section 20, it is preferable that the substantial driving portion 18 is formed to be positioned from a part of the movable section 20 to a part of the thin plate sections 16a and 16b. This is because when the substantial driving portion 18 is formed further to a part of the fixing section 22, the displacement operation of the movable section 20 is restricted as described in the foregoing.

In this case, when all the first electrode 28, the second electrode 30 and the piezoelectric/electrostrictive layer 26 are formed to be positioned from a part of the movable section 20 to a part of the thin plate sections 16a and 16b, in addition to the positional relationship of the substantial driving portion 18, the movable section 20 can be displaced substantially in parallel to the fixing section 22, and thus it is preferable since the damages on the thin plate sections 16a and 16b are suppressed and shock resistance against the external force is increased.

A preferred constitutional embodiment of the piezoelectric/electrostrictive device 10A according to this embodiment will be described.

In order to ensure the displacement operation of the movable section 20, it is preferable that the length Lg where the substantial driving portion 18 of the piezoelectric/electrostrictive elements 24a and 24b overlaps the fixing section 22 or the movable section 20 is ½ or more of the thickness Ld of the thin plate sections 16a and 16b.

The ratio La/Lb of the distance La between the inner walls of the thin plate sections 16a and 16b (distance in the X axis direction) to the width Lb of the thin plate sections 16a and 16b is from 0.5 to 20. The ratio La/Lb is preferably from 1 to 10, and more preferably from 2 to 8. The stipulated value of the ratio La/Lb is the provision based on the finding that the displacement amount of the movable section 20 is increased, and the displacement can be predominantly obtained in the X-Z plane.

On the other hand, the ration Le/La of the length Le of the thin plate sections 16a and 16b (length in the Z axis direction) to the distance La between the inner walls of the thin plate sections 16a and 16b is preferably from 0.5 to 10, and more preferably from 0.7 to 5. The stipulated value of the ratio Le/La is the provision based on the finding that the displacement amount of the movable section 20 is increased, and the displacement operation can be conducted at a high resonance frequency (i.e., a high response speed can be attained).

Therefore, in order to make the piezoelectric/electrostrictive device 10A according to the first embodiment to have a suppressed bending displacement or vibration in the Y direction and excellence in high speed response performance with large displacement at a relatively low voltage, it is preferable that the ratio La/Lb is from 0.5 to 20, and the ratio Le/La is from 0.5 to 10, and it is more preferable that the ratio La/Lb is from 1 to 10, and the ratio Le/La is from 0.7 to 5. Furthermore, it is preferable that a gel-like material, such as silicone gel, is filled in the hole 12.

The length Lf of the movable section 20 (length in the Z axis direction) is preferably short. This is because the light weight and the increase in resonance frequency can be realized by the increase thereof. However, in order to ensure the rigidity of the movable section 20 in the X axis direction and the displacement thereof, it is preferable that the ratio Lf/Ld of the length Lf of the movable section 20 (length in the Z axis direction) to the thickness Ld of the thin plate sections 16a and 16b is 3 or more, and more preferably 5 or more.

The actual dimensions of the respective parts are determined by considering the connecting area of the movable section 20 for attachment of the parts, the connecting area for attaching the fixing section 22 to other members, the connecting area for attaching the terminals for the electrodes or the like, and the strength, the durability, the necessary displacement amount, the resonance frequency and the driving voltage of the entire piezoelectric/electrostrictive device 10A.

Specifically, the distance La between the inner walls of the thin plate sections 16a and 16b is preferably from 100 µm to 2,000 µm, and more preferably from 200 µm to 1,000 µm. The width Lb of the thin plate sections 16a and 16b is preferably from 50 µm to 2,000 µm, and more preferably from 100 µm to 500 µm. The relationship of the thickness Ld of the thin plate sections 16a and 16b to the width Lb of the thin plate sections 16a and 16b is Lb>Ld in order to effectively suppress the bending displacement, which is the displacement component in the Y axis direction, and the thickness Ld of the thin plate sections 16a and 16b is preferably from 2 µm to 100 µm, and more preferably from 4 µm to 50 µm.

The length Le of the thin plate sections 16a and 16b is preferably from 200 to 3,000 µm, and more preferably from 300 µm to 2,000 µm. The length Lf of the movable section 20 is preferably from 50 µm to 2,000 µm, and more preferably from 100 µm to 1,000 µm.

By employing the arrangement, such an excellent effect is exhibited that while the displacement in the Y axis direction does not exceed 10% with respect to the displacement in the X direction, the low voltage driving can be conducted by appropriately adjusting the dimensional ratios and the actual dimensions within the foregoing ranges, and the displacement component in the Y axis direction can be suppressed to 5% or less. That is, the movable section 20 is displaced substantially in one direction, i.e., the X axis direction, and excellent in high speed response performance and provides large displacement with a relatively low voltage.

In the piezoelectric/electrostrictive device 10A, the shape of the device is not the conventional plate form, but the movable section 20 and the fixing section 22 exhibit a rectangular parallelepiped shape, and the pair of the thin plate sections 16a and 16b are provided in such a manner that the side surfaces of the movable section 20 and the fixing section 22 are continued, whereby the rigidity in the Y direction of the piezoelectric/electrostrictive device 10A can be selectively increased.

That is, the piezoelectric/electrostrictive device 10A can selectively generate only the operation of the movable section 20 in the plane (in the XZ plane), and the operation of the movable section 20 in the YZ plane (operation in the so-called bending direction) can be suppressed.

The respective components of the piezoelectric/electrostrictive device 10A according to the first embodiment will be described.

As described above, the movable section 20 is the portion which is operated on the basis of the driving amount of the thin plate sections 16a and 16b, and a variety of members are attached thereto depending on the purpose of use of the piezoelectric/electrostrictive device 10A. For example, when the piezoelectric/electrostrictive device 10A is used as a displacement element, a shield plate for an optical shutter or the like is attached thereto, and especially, when the piezoelectric/electrostrictive device 10A is used for the mechanism for positioning or suppressing the ringing of a magnetic head of a hard disk drive, a member required to be positioned is attached thereto, including, for example, the magnetic head, a slider provided with the magnetic head, and a suspension provided with the slider.

As described above, the fixing section 22 is the portion for supporting the thin plate sections 16a and 16b and the movable section 20. In addition, the fixing section 22 also serves as the portion for attaching and securing the piezoelectric/electrostrictive device 10A to another member. For example, when the fixing section 22 is utilized to position the magnetic head of the hard disk drive, the entire piezoelectric/electrostrictive device 10A is fixed by supporting and securing the fixing section 22, for example, to a carriage arm attached to VCM (voice coil motor) or a fixing plate or a suspension attached to the carriage arm. As shown in FIG. 1, the terminals 32 and 34 for driving the piezoelectric/electrostrictive elements 24a and 24b and other members are arranged on the fixing section 22 in some cases.

The material for constructing the movable section 20 and the fixing section 22 is not specifically limited provided that it has rigidity. However, it is possible to suitably use ceramics, to which the ceramic green sheet-laminating method is applicable as described later. Specifically, the material includes, for example, materials containing a major component of zirconia represented by fully stabilized zirconia and partially stabilized zirconia, alumina, magnesia, silicon nitride, aluminum nitride, and titanium oxide, as well as materials containing a major component of a mixture of those materials, and in view of the high mechanical strength and the high toughness, it is preferable to use a material containing a major component of zirconia, especially fully stabilized zirconia and a material containing a major component of partially stabilized zirconia. The metallic material is not limited provided that it has rigidity, and the metallic material includes, for example, stainless steel and nickel. Further, it is also possible to use engineering plastics.

As described above, the thin plate sections 16a and 16b are the portions, which are driven in accordance with the displacement of the piezoelectric/electrostrictive elements 24a and 24b. The thin plate sections 16a and 16b are the thin plate-shaped member having flexibility, and they function to amplify the expansion and contracting displacement of the piezoelectric/electrostrictive elements 24a and 24b arranged on the surface as the bending displacement and transmit the displacement to the movable section 20. Therefore, it is enough that the shape or the material of the thin plate sections 16a and 16b provides the flexibility and the mechanical strength of such a degree that it is not broken by the bending displacement. It is possible to make appropriate selection considering the response performance and the operability of the movable section 20.

It is preferable that the thickness Ld of the thin plate sections 16a and 16b is preferably about from 2 µm to 100 µm. It is preferable that the combined thickness of the thin plate section 16a (or 16b) and the piezoelectric/electrostrictive element 24a (or 24b) is from 7 µm to 500 µm. It is preferable that the thickness of the electrodes 28 and 30 is from 0.1 to 50 µm, and the thickness of the piezoelectric/electrostrictive layer 26 is from 3 to 300 µm. The width Lb of the thin plate sections 16a and 16b is preferably from 50 µm to 2,000 µm.

Ceramics, which is similarly used for the movable section 20 and the fixing section 22, can be preferably used as the material for constructing the thin plate sections 16a and 16b. A material containing a major component of zirconia, especially fully stabilized zirconia and a material containing a major component of partially stabilized zirconia are most preferably used because the mechanical strength is large even in the case of a thin wall thickness, the toughness is high, and the reactivity with the piezoelectric/electrostrictive layer and the electrode material is small.

When the thin plate sections 16a and 16b are made of a metallic material, it is enough that the metallic material has flexibility and the metallic material is capable of bending displacement as described above, and preferably, it is desirable that they are made of an iron-based material such as various stainless steel materials and various spring steel materials. Alternatively, it is desirable that they are made of a non-ferrous material such as beryllium copper, phosphor bronze, nickel, and nickel-iron alloy.

Those, which are fully stabilized or partially stabilized as follows, are preferably used as fully stabilized zirconia or partially stabilized zirconia as described above. That is, the compound to be used for fully stabilizing or partially stabilizing zirconia includes yttrium oxide, ytterbium oxide, cerium oxide, calcium oxide and magnesium oxide. When at least one compound of them is added and contained, zirconia is partially or fully stabilized, and as for the stabilization, the zirconia can be stabilized not only by adding one type of the compound but also by adding a combination of the compounds.

The amount of addition of each of the compounds is desirably from 1 to 30 mol %, and preferably from 1.5 to 10 mol % for yttrium oxide or ytterbium oxide; from 6 to 50 mol %, and preferably from 8 to 20 mol % for cerium oxide; and from 5 to 40 mol %, and preferably from 5 to 20 mol % for calcium oxide or magnesium oxide, and it is preferable to use yttrium oxide as a stabilizer. In this case, the addition amount of yttrium oxide is desirably from 1.5 to 10 mol %, and more preferably from 2 to 4 mol %. For example, alumina, silica, or transition metal oxide may be added as an additive of sintering aid or the like in a range of from 0.05 to 20% by weight, and when the firing integration based on the film formation method is adopted as a technique for forming the piezoelectric/electrostrictive elements 24a and 24b, it is also preferable to add, for example, alumina, magnesia, and transition metal oxide as an additive.

In order to obtain the mechanical strength and the stable crystal phase, it is desirable that the average crystal grain size of zirconia is from 0.05 to 3 μm, and preferably from 0.05 to 1 μm. As described above, ceramics can be used for the thin plate sections 16a and 16b in the same manner as the movable section 20 and the fixing section 22, and preferably, it is advantageous to construct the thin plate sections 16a and 16b with a substantially identical material in view of the reliability of the joined portion and the strength of the piezoelectric/electrostrictive device 10A, in order to reduce any complicated procedure of the production.

The piezoelectric/electrostrictive elements 24a and 24b have at least the piezoelectric/electrostrictive layer 26 and the pair of electrodes 28 and 30 for applying the electric field to the piezoelectric/electrostrictive layer 26. It is possible to use, for example, piezoelectric/electrostrictive elements of the unimorph type and the bimorph type, and those of the unimorph type relating to the combination of the thin plate sections 16a and 16b are suitable for the piezoelectric/electrostrictive device 10A as described above because they are excellent in stability of the generated displacement amount and they are advantageous to realize the light weight.

For example, as shown in FIG. 1, it is possible to suitably use, for example, the piezoelectric/electrostrictive element comprising the first electrode 28, the piezoelectric/electrostrictive layer 26, and the second electrode 30 which are stacked in the layered configuration, and additionally, it is also preferable to provide the multiple stage structure as shown in FIGS. 6 to 10.

As shown in FIG. 1, the piezoelectric/electrostrictive elements 24a and 24b are preferably formed on the outer surface of the piezoelectric/electrostrictive device 10A in view of the fact that the thin plate sections 16a and 16b can be driven to a greater extent, and the piezoelectric/electrostrictive elements 24a and 24b may be formed on the inner surface of the piezoelectric/electrostrictive device 10A, i.e., on the inner wall surface of the hole 12 depending on, for example, the form of use. Alternatively, the piezoelectric/electrostrictive elements 24a and 24b may be formed both on the outer surface and on the inner surface of the piezoelectric/electrostrictive device 10A.

Piezoelectric ceramics is preferably used for the piezoelectric/electrostrictive layer 26, and it is also possible to use electrostrictive ceramics, ferroelectric ceramics, or anti-ferroelectric ceramics. However, when the piezoelectric/electrostrictive device 10A is used, for example, to position the magnetic head of the hard disk drive, because it is important to provide the linearity concerning the displacement amount of the movable section and the driving voltage or the output voltage, it is preferable to use a material having small strain hysteresis, and it is also preferable to use a material having a coercive electric field of not more than 10 kV/mm.

Specifically, it is possible to use materials such as ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate singly or in mixture.

Especially, a material containing a major component of lead zirconate, lead titanate, and lead magnesium niobate, or a material containing a major component of sodium bismuth titanate is preferably used, in order to obtain the product having a stable composition with a high electromechanical coupling factor and a piezoelectric constant and with small reactivity with the thin plate sections (ceramics) 16a and 16b during the firing of the piezoelectric/electrostrictive layer 26.

It is also preferable to use ceramics, obtained by adding to the material described above, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and tin singly or in mixture.

For example, when lanthanum or strontium is contained in the major components of lead zirconate, lead titanate and lead magnesium niobate, an advantage is obtained in some cases, for example, in such a way that the coercive electric field and the piezoelectric characteristic can be adjusted.

It is desirable to avoid the addition of a material such as silica, which tends to form glass. This is because the material such as silica tends to react with the piezoelectric/electrostrictive material during the heat treatment for the piezoelectric/electrostrictive layer, whereby as a result, the composition is varied, and the piezoelectric characteristic is deteriorated.

On the other hand, it is preferable that the pair of electrodes 28 and 30 of the piezoelectric/electrostrictive elements 24a and 24b are made of metal which is solid at room temperature and which is excellent in conductivity. For example, it is possible to use metal simple substance or alloy of, for example, aluminum, titanium, chromium, iron, cobalt, nickel, copper, zinc, niobium, molybdenum, ruthenium, palladium, rhodium, silver, tin, tantalum, tungsten, iridium, platinum, gold and lead. It is also preferable to use a cermet material obtained by dispersing, in the metal described above, the same material as that of the piezoelectric/electrostrictive layer 26 or the thin plate sections 16a and 16b.

The material for the electrodes 28 and 30 of the piezoelectric/electrostrictive elements 24a and 24b is selected and determined depending on the method of forming the piezoelectric/electrostrictive layer 26. For example, when the piezoelectric/electrostrictive layer 26 is formed by firing on the first electrode 28 after the first electrode 28 is formed on the thin plate sections 16a and 16b, it is necessary for the first electrode 28 to use high melting point metal such as platinum, palladium, a platinum-palladium alloy, a silver-palladium alloy and a gold-palladium alloy which does not change at the firing temperature for the piezoelectric/electrostrictive layer 26. However, because the electrode formation can be performed at a low temperature for the second electrode 30 which is formed on the piezoelectric/electrostrictive layer 26 after forming the piezoelectric/electrostrictive layer 26, it is possible for the second electrode 30 to use low melting point metal such as aluminum, gold and silver.

The thickness of the electrodes 28 and 30 also serve as a factor to considerably decrease the displacement of the piezoelectric/electrostrictive elements 24a and 24b. Therefore, it is preferable, especially for the electrodes 28 and 30 formed after the firing of the piezoelectric/electrostrictive layer 26, to use organic metal paste capable of obtaining a dense and thinner film after the firing, for example, a material such as gold resinate paste, platinum resinate paste and silver resinate paste.

The method of producing the piezoelectric/electrostrictive device 10A according to the first embodiment will be described with reference to FIGS. 16A to 18.

Ceramics is preferably used for the constitutive material for each of the members of the piezoelectric/electrostrictive device 10A according to the first embodiment of the invention. It is preferable that the constitutive elements of the piezoelectric/electrostrictive device 10A concerning the substrate 14 except for the piezoelectric/electrostrictive elements 24a and 24b, i.e., the thin plate sections 16a and 16b, the fixing section 22 and the movable section 20 are produced by using the ceramic green sheet-laminating method. On the other hand, it is preferable that the piezoelectric/electrostrictive elements 24a and 24b as well as the respective terminals 32 and 34 are produced by using the film formation method, for example, for the thin film and the thick film.

According to the ceramic green sheet-laminating method in which the respective members of the substrate 14 of the piezoelectric/electrostrictive device 10A can be formed integrally, the time-dependent change of state scarcely occurs at the joined portions of the respective members, and therefore, this method provides the high reliability of the joined portion, and it is advantageous to ensure the rigidity.

In the piezoelectric/electrostrictive device 10A according to the first embodiment, the boundary portion (joined portion) between the thin plate sections 16a and 16b and the fixing section 22 and the boundary portion (joined portion) between the thin plate sections 16a and 16b and the movable section 20 function as supporting points for expressing the displacement. Therefore, the reliability of the joined portion is an important point, which dominates the characteristic of the piezoelectric/electrostrictive device 10A.

Because the production methods described below are excellent in reproducibility and formability, it is possible to obtain the piezoelectric/electrostrictive device having a predetermined shape within a short period of time with good reproducibility.

A method of producing the piezoelectric/electrostrictive device 10A according to the first embodiment of the invention will be specifically explained below. The following definitions are now made. The laminate that is obtained by laminating the ceramic green sheets is defined to be the ceramic green laminate 58 (see, for example, FIG. 16B). The integrated matter that is obtained by firing the ceramic green laminate 58 is defined to be the ceramic laminate 60 (see, for example, FIG. 17). The integrated matter comprising the movable section 20, the thin plate sections 16a and 16b, and the fixing section 22 that is obtained by cutting off unnecessary portions from the ceramic laminate 60 is defined to be the ceramic substrate 14C (see FIG. 18).

In this production method, the ceramic laminate 60 is finally cut into chip units to produce a large number of piezoelectric/electrostrictive devices 10A. However, in order to simplify the explanation, description will be made principally for the case in which one individual of piezoelectric/electrostrictive device 10A is produced.

At first, for example, a binder, a solvent, a dispersing agent and a plasticizer are added and mixed with a ceramic powder such as zirconia to prepare a slurry. The slurry is subjected to a degassing treatment, and then a ceramic green sheet having a predetermined thickness is prepared in accordance with, for example, the reverse roll coater method and the doctor blade method.

Figure 16B:
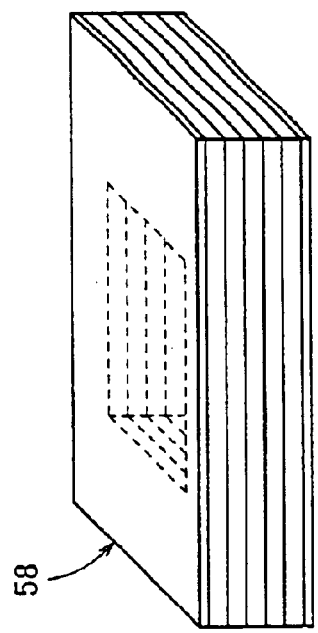
FIG. 16B illustrates a state, in which a ceramic green laminate is formed.
Figure 16A:
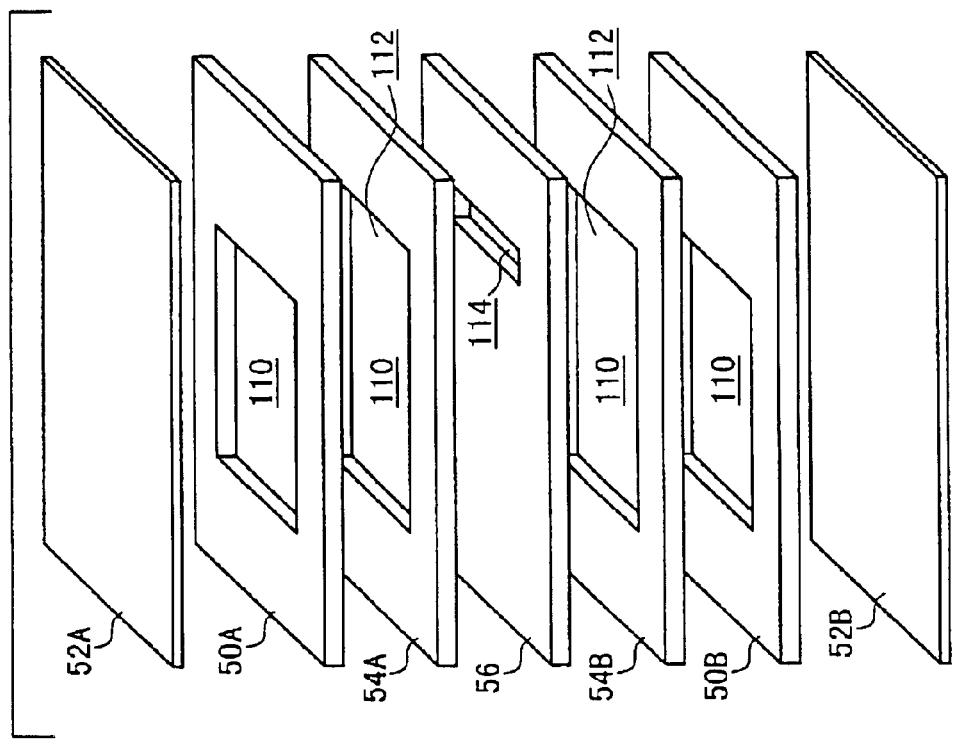
FIG. 16A illustrates a process for laminating necessary ceramic green sheets in accordance with a production method of the piezoelectric/electrostrictive device according to the first embodiment.

Subsequently, the ceramic green sheet is processed into those having various shapes as shown in FIG. 16A in accordance with, for example, the punching out based on the die and the laser machining to obtain a plurality of ceramic green sheets 50A, 50B, 52A, 52B, 54A, 54B and 56 for forming the substrate.

The ceramic green sheets 50A, 50B, 52A, 52B, 54A, 54B and 56 include the plurality of ceramic green sheets 50A and 50B each of which is formed with at least a window 110 for forming the hole 12 thereafter, the plurality of ceramic green sheets 54A and 54B each of which is continuously formed with at least a window 110 for forming the hole 12 thereafter and at least a window 112 for forming a cavity portion 102, one, for example, ceramic green sheet 56 which is formed with at least a window 114 to be formed into a stopper member 122 thereafter, and a plurality of ceramic green sheets 52A, 52B to be formed into the thin plate sections 16a and 16b thereafter. The numbers of ceramic green sheets referred to above are discussed by way of example only.

Thereafter, as shown in FIG. 16B, the ceramic green sheets 50A, 50B, 52A, 52B, 54A, 54B and 56 are laminated and pressure-secured so that the ceramic green sheets 50A, 50B, 54A, 54B and 56 are interposed between the ceramic green sheets 52A, 52B and the ceramic green sheet 56 is located at the center with the ceramic green sheets 54A and 54B on its top and bottom, respectively, to form a ceramic green laminate 58. Then, the ceramic green laminate 58 is fired to obtain a ceramic laminate 60 (see FIG. 17).

There is no limitation for the number of pressure-securing steps and the sequence for the purpose of the laminating and integration into one unit. These factors can be appropriately determined depending on the structure, for example, so that the desired structure is obtained on the basis of, for example, the shape of the windows 110, 112 and 114 and the number of ceramic green sheets.

It is unnecessary that the shape of the windows 110, 112 and 114 is identical in all cases, and it can be determined depending on the desired function. There is also no limitation for the number of ceramic green sheets and the thickness of each of the ceramic green sheets.

In the pressure-securing step, it is possible to further improve the laminating performance by applying the heat. The laminating performance at the boundary of the ceramic green sheet can be improved by providing an auxiliary joining layer, for example, by applying and printing, onto the ceramic green sheet, a paste or a slurry principally containing a ceramic powder (it is preferable to use a composition which is the same as or similar to that of the ceramics used for the ceramic green sheet in order to ensure the reliability) and the binder. When the ceramic green sheets 52A and 52B are thin, it is preferable to handle them with a plastic film, especially with a polyethylene terephthalate film coated with a releasing agent based on silicone on the surface.

Figure 17:
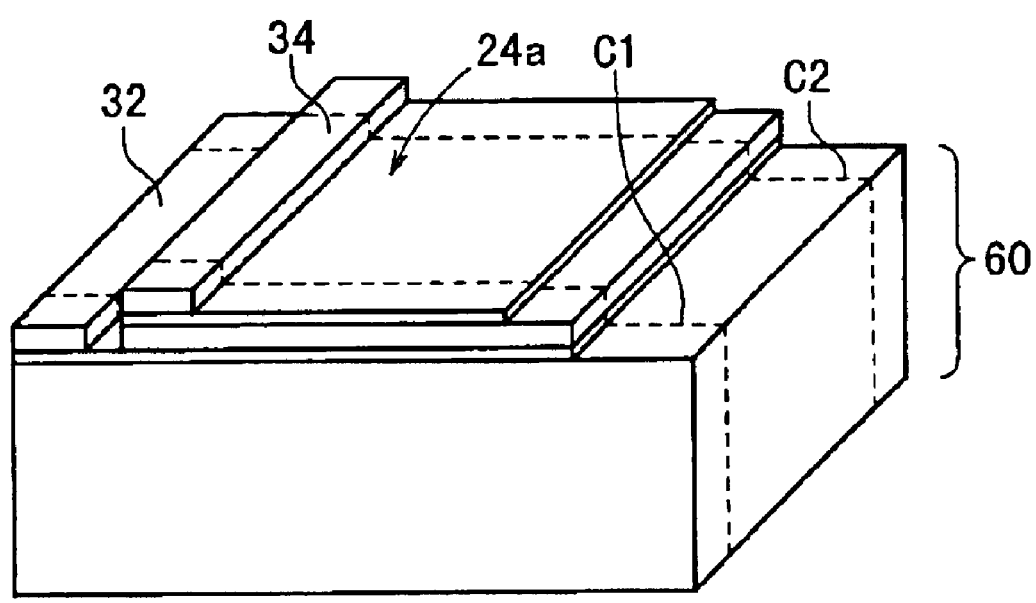
FIG. 17 illustrates a state in the production method, in which the ceramic green laminate is fired into the ceramic laminate, and then a piezoelectric/electrostrictive element is formed on the ceramic laminate.

Subsequently, as shown in FIG. 17, the piezoelectric/electrostrictive elements 24a and 24a are formed respectively on both surfaces of the ceramic laminate 60, i.e., on the surfaces corresponding to the surfaces, at which the ceramic green sheets 52A and 52B are laminated. Those usable as the method of forming the piezoelectric/electrostrictive elements 24a and 24a include the thick film formation method, such as the screen printing method, the dipping method, the coating method and the electrophoresis method, and the thin film formation method, such as the ion beam method, the sputtering method, the vacuum vapor deposition, the ion plating method, the chemical vapor deposition method (CVD) and the plating.

When the piezoelectric/electrostrictive elements 24a and 24b are formed by using the film formation method as described above, the piezoelectric/electrostrictive elements 24a and 24b and the thin plate sections 16a and 16b can be integrally joined and arranged without using any adhesive, whereby it is possible to ensure the reliability and the reproducibility, and it is easy to form the stack.

In this case, it is preferable that the piezoelectric/electrostrictive elements 24a and 24b are formed by means of the thick film formation method. This is because, especially, when the piezoelectric/electrostrictive layer 26 is formed by using the thick film formation method, the film can be formed by using, for example, a paste, a slurry, a suspension, an emulsion, or a sol containing a major component of particles or powder of piezoelectric ceramics having an average particle size of from 0.01 to 5 $\mu$m, preferably from 0.05 to 3 $\mu$m, and thus it is possible to obtain good piezoelectric/electrostrictive characteristics by firing the formed film.

The electrophoresis method is advantageous in that the film can be formed at a high density with a high shape accuracy. The screen printing method is advantageous to simplify the production step because it is possible to simultaneously perform the film formation and the pattern formation.

The formation of the piezoelectric/electrostrictive elements 24a and 24a will be described. At first, the ceramic green laminate 58 is fired and integrated into one unit at a temperature of from 1,200 to 1,600° C. to obtain the ceramic laminate 60, and then the first electrodes 28 are printed and fired at predetermined positions on both surfaces of the ceramic laminate 60. Subsequently, the piezoelectric/electrostrictive layers 26 are printed and fired, and further, the second electrodes 30 are printed and fired to form the piezoelectric/electrostrictive elements 24a and 24a. After that, the terminals 32 and 34 are printed and fired in order to electrically connect the respective electrodes 28 and 30 to the driving circuit.

In this process, when the materials are selected in such a manner that the firing temperature for each of the members is lowered in accordance with the stacking sequence, for example, when platinum (Pt) is used for the first electrode 28, lead zirconate titanate (PZT) is used for the piezoelectric/electrostrictive layer 26, gold (Au) is used for the second electrode 30, and silver (Ag) is used for the terminals 32 and 34, the material that has been already fired beforehand is not sintered again at a certain firing stage, and thus, it is possible to avoid the occurrence of inconvenience such as peeling off and aggregation of the electrode material or the like.

When appropriate materials are selected, it is also possible to successively print the respective members of the piezoelectric/electrostrictive elements 24a and 24b and the terminals 32 and 34, followed by the firing at one time. Further, it is also possible to provide, for example, the respective electrodes 30 at a low temperature after forming the piezoelectric/electrostrictive layers 26.

It is also possible that the respective members of the piezoelectric/electrostrictive elements 24a and 24b and the terminals 32 and 34 are formed in accordance with the thin film formation method such as the sputtering method and the vapor deposition method, and in this case, it is not necessarily indispensable to perform the heat treatment.

In the formation of the piezoelectric/electrostrictive elements 24a and 24b, it is preferably conducted that the piezoelectric/electrostrictive elements 24a and 24b are previously formed on both surfaces of the ceramic green laminate 58, i.e., on the respective surfaces of the ceramic green sheets 52A and 52B, and then the ceramic green laminate 58 and the piezoelectric/electrostrictive elements 24a and 24b are co-fired. Upon co-firing, it is possible that the ceramic green laminate 58 and all the constitutional films of the piezoelectric/electrostrictive elements 24a and 24b are subjected to firing, or in alternative, those methods can be exemplified in that the first electrode 28 and the ceramic green laminate 58 are co-fired, and constitutional films other than the second electrode 30 and the ceramic green laminate 58 are co-fired.

As a method of co-firing the piezoelectric/electrostrictive elements 24a and 24b and the ceramic green laminate 58, such a method can be exemplified in that a precursor of the piezoelectric/electrostrictive layer 26 is formed, for example, by the tape forming method using the slurry raw materials, and then the precursor of the piezoelectric/electrostrictive layer 26 before firing is laminated on the surface of the ceramic green laminate 58, for example, by heat pressure-securing, followed by conducting co-firing, so as to simultaneously produce the movable section 20, the thin plate sections 16a and 16b, the piezoelectric/electrostrictive layer 26 and the fixing section 22. In this method, however, it is necessary that the electrode 28 be previously formed on the surface of the ceramic green laminate 58 and/or the piezoelectric/electrostrictive layer 26.

Other methods can be exemplified in that the electrodes 28 and 30 and the piezoelectric/electrostrictive layer 26, which are the constitutional layers of the piezoelectric/electrostrictive elements 24a and 24b, are formed by screen printing on such parts of the ceramic green laminate 58 that finally become the thin plate sections 16a and 16b, followed by co-firing.

The firing temperature of the piezoelectric/electrostrictive elements 24a and 24b is appropriately determined by the materials constituting them, and is generally from 500 to 1,500° C., and preferably from 1,000 to 1,400° C. for the piezoelectric/electrostrictive layer 26. In this case, in order to control the composition of the piezoelectric/electrostrictive layer 26, it is preferable that the sintering is conducted in the presence of the evaporation source of the material of the piezoelectric/electrostrictive layer 26. In the case where the piezoelectric/electrostrictive layer 26 and the ceramic green laminate 58 are co-fired, it is necessary that the firing conditions of them agree with each other. The piezoelectric/electrostrictive elements 24a and 24b are not necessarily formed on both surfaces of the ceramic laminate 60 or the ceramic green laminate 58, but of course, may be formed only on one surface thereof.

Subsequently, unnecessary portions are cut off from the ceramic laminate 60 formed with the piezoelectric/electrostrictive elements 24a and 24b as described above. The cutoff positions are located at side portions of the ceramic laminate 60, especially at portions, at which the hole 12 based on the window 110 is formed on the side surfaces of the ceramic laminate 60 by means of the cutoff (see cutting lines C1 and C2).

Those applicable as the cutoff method include the mechanical machining such as the dicing machining, the slicing machining and the wire saw machining, as well as the laser machining based on the use of, for example, the YAG laser and the excimer laser, and the electron beam machining.

Figure 18:
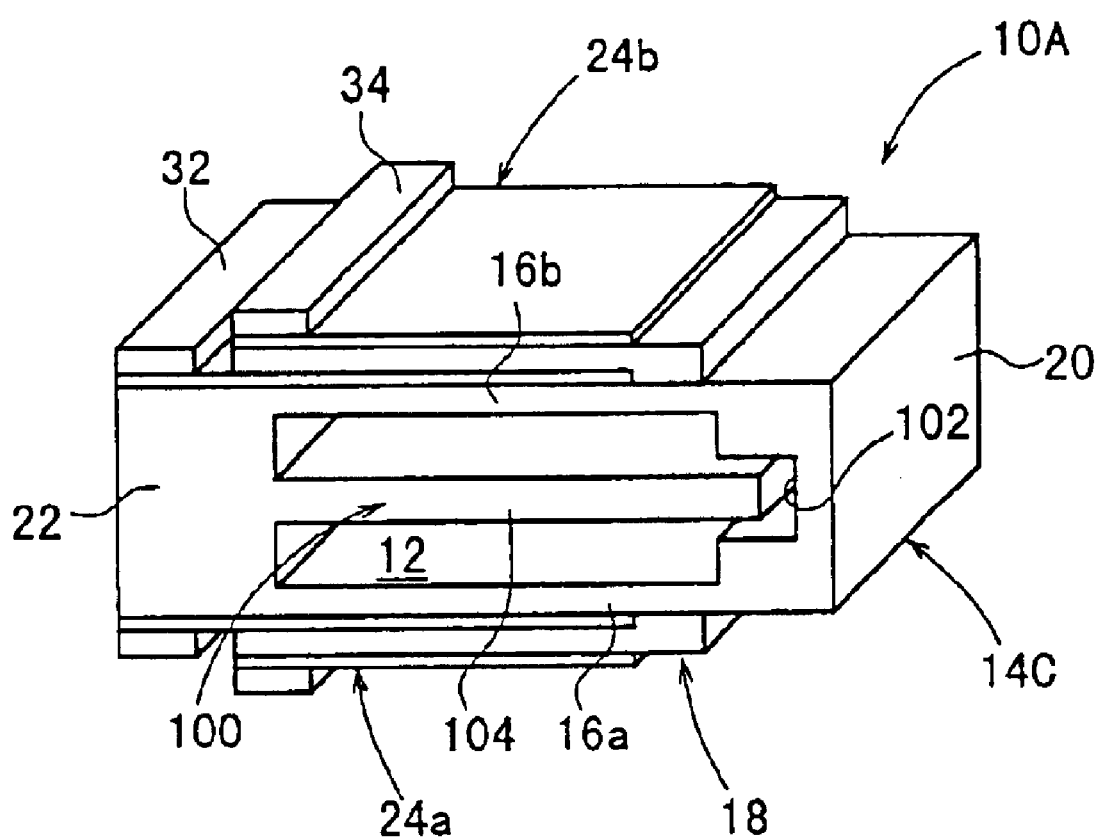
FIG. 18 illustrates a state, in which the ceramic laminate is cut along predetermined cutting lines to provide the piezoelectric/electrostrictive device according to the first embodiment.

By the cutoff as shown in FIG. 18, the piezoelectric/electrostrictive elements 24a and 24b are formed on the ceramic substrate 14C. Further, the cavity portion 102 is formed on the inner wall 20a of the movable section 20. Thus, the piezoelectric/electrostrictive device 10A is obtained where the stopper member 104 is formed on the fixing portion 22 with its forward end 104a entering into the cavity portion 102.

In this production method, when the unnecessary parts are cut off from the ceramic laminate 60, the piezoelectric/electrostrictive elements 24a and 24b are formed on the ceramic substrate 14C. Further, when the unnecessary parts are cut off from the ceramic laminate 60, a cavity portion 102 is formed on the inner wall 20a of the movable section 20 in order to obtain a piezoelectric/electrostrictive device 10A in which a stopper member 104 is formed in the fixing section 22 whose forward end 104a enters the cavity portion 102. Therefore, the production process can be simplified, and the yield of the piezoelectric/electrostrictive device 10A can be improved.

Especially, the unnecessary parts may be cut off from the ceramic laminate 60 by means of machining, for example. In that case, some stress is applied and vibrates the thin plate sections 16a and 16b. In some cases, the amplitude damages the thin plate sections 16a and 16b. However, according to this embodiment, the stopper member 104 is provided. Therefore, the vibration (amplitude) during cut-off is restricted, which can improve the productivity of the piezoelectric/electrostrictive device 10A.

In the piezoelectric/electrostrictive device 10A according to the first embodiment and each of the modified examples 10Aa to 10Ai, the mechanism 100 includes the cavity portion 102 formed on the inner wall 20a of the movable section 20 and the stopper member 104 formed on the inner wall 22a of the fixing portion 22 whose forward end 104a enters the cavity portion 102. Alternatively, as in the piezoelectric/electrostrictive device 10Aj according to a tenth modified example shown in FIG. 19, the cavity portion 102 may be formed on the inner wall 22a of the fixing section 22 and the stopper member 104 may be formed on the inner wall 20a of the movable section 20 in order to form the mechanism 100.

In this case, when the external force is applied to the movable section 20 and the thin plate sections 16a and 16b, which causes the movable section 20 and the thin plate sections 16a and 16b to vibrate to great extent, the mechanism 100 can restrict the vibration (amplitude) of the movable section 20 and the thin plate sections 16a and 16b. As a result, it can prevent the thin plate sections 16a and 16b from being damaged. In this case, the thin place sections 16a and 16b do not need to be thickened. Therefore, it does not deteriorate device characteristics such as the displacement characteristic and the response characteristic.

The piezoelectric/electrostrictive device 10B according to the second embodiment will be described with reference to FIG. 20. The same symbols are attached to those members that correspond to the piezoelectric/electrostrictive device 10A and the respective modified examples 10Aa to 10Ai, so as to omit the duplicate explanations.

Figure 20:
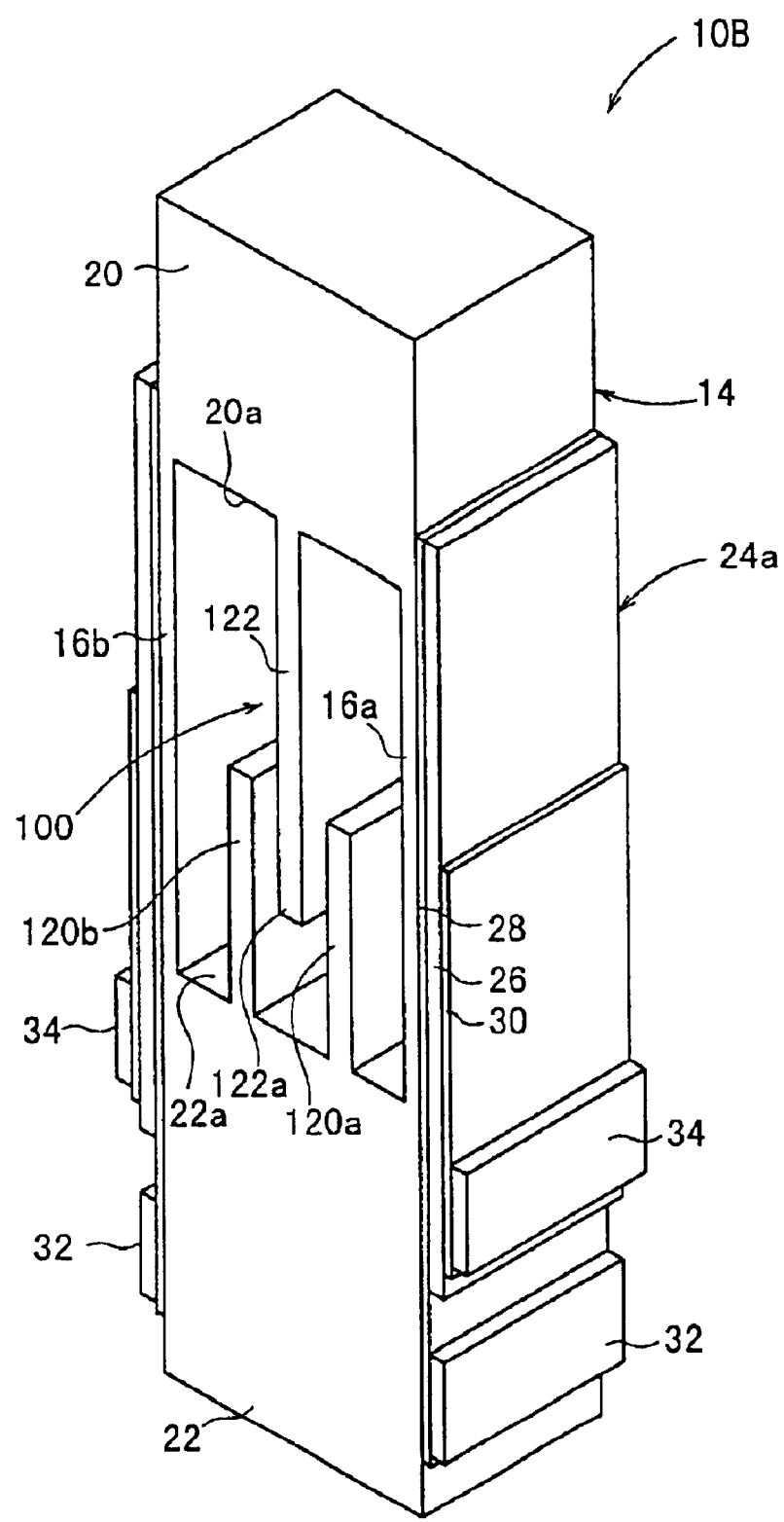
FIG. 20 shows a perspective view illustrating an arrangement of a piezoelectric/electrostrictive device according to a second embodiment.

As shown in FIG. 20, the piezoelectric/electrostrictive device 10B according to the second embodiment has the similar constitution as the piezoelectric/electrostrictive device 10A according to the first embodiment, except that the mechanism 100 for restricting amplitude of the thin plate sections 16a and 16b includes two buffer members 120a and 120b provided on the inner wall 22a of the fixing section 22 and a stopper member 122 provided on the inner wall 20a of the movable section 20 whose forward end 122a enters between the two buffer members 120a and 120b.

Also in this case, it is preferable that a shortest distance from the forward end 122a of the stopper member 122 to the buffer member 120a or 120b in the direction in which the movable section 20 is displaced is not more than a tolerance limit of the amplitude of the movable section and the thin plate sections 16a and 16b.

In the piezoelectric/electrostrictive devices 10B according to the second embodiment, the forward end 122a of the stopper member 122 hits the buffer member 120a or 120b so that the vibration (amplitude) of the movable section 20 and the thin plate sections 16a and 16b can be restricted.

Especially, the appropriately adjusted aspect ratio of height and thickness of the buffer members 120a and 120b gives resilience so as to absorb shocks caused when the stopper member 122 hits the buffer members 120a and 120b.

Figure 21:
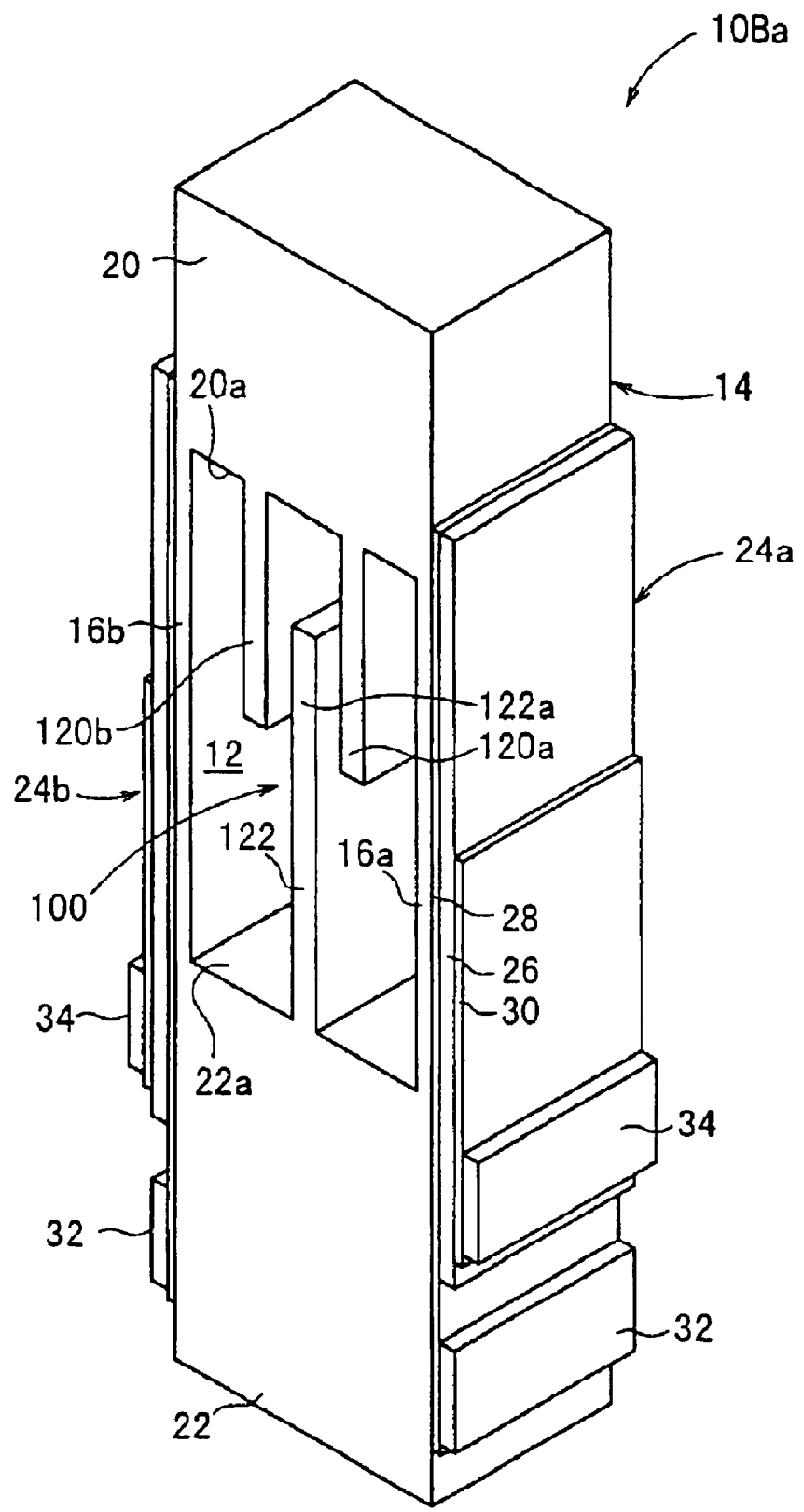
FIG. 21 shows a perspective view illustrating a modified example of a piezoelectric/electrostrictive device according to the second embodiment.

In this case, as in the piezoelectric/electrostrictive devices 10Ba according to a modified example shown in FIG. 21, the two buffer members 120a and 120b may be provided on the inner wall 20a of the movable section 20 and the stopper member 122 may be provided on the inner wall 22a of the fixing section 22.

The piezoelectric/electrostrictive device 10C according to the third embodiment will be described with reference to FIG. 22. The same reference numbers will be given to those members corresponding to those in the piezoelectric/electrostrictive devices 10A according to the first embodiment and in each of modified examples 10Aa to 10Ai, and their repetitive descriptions will be omitted here.

Figure 22:
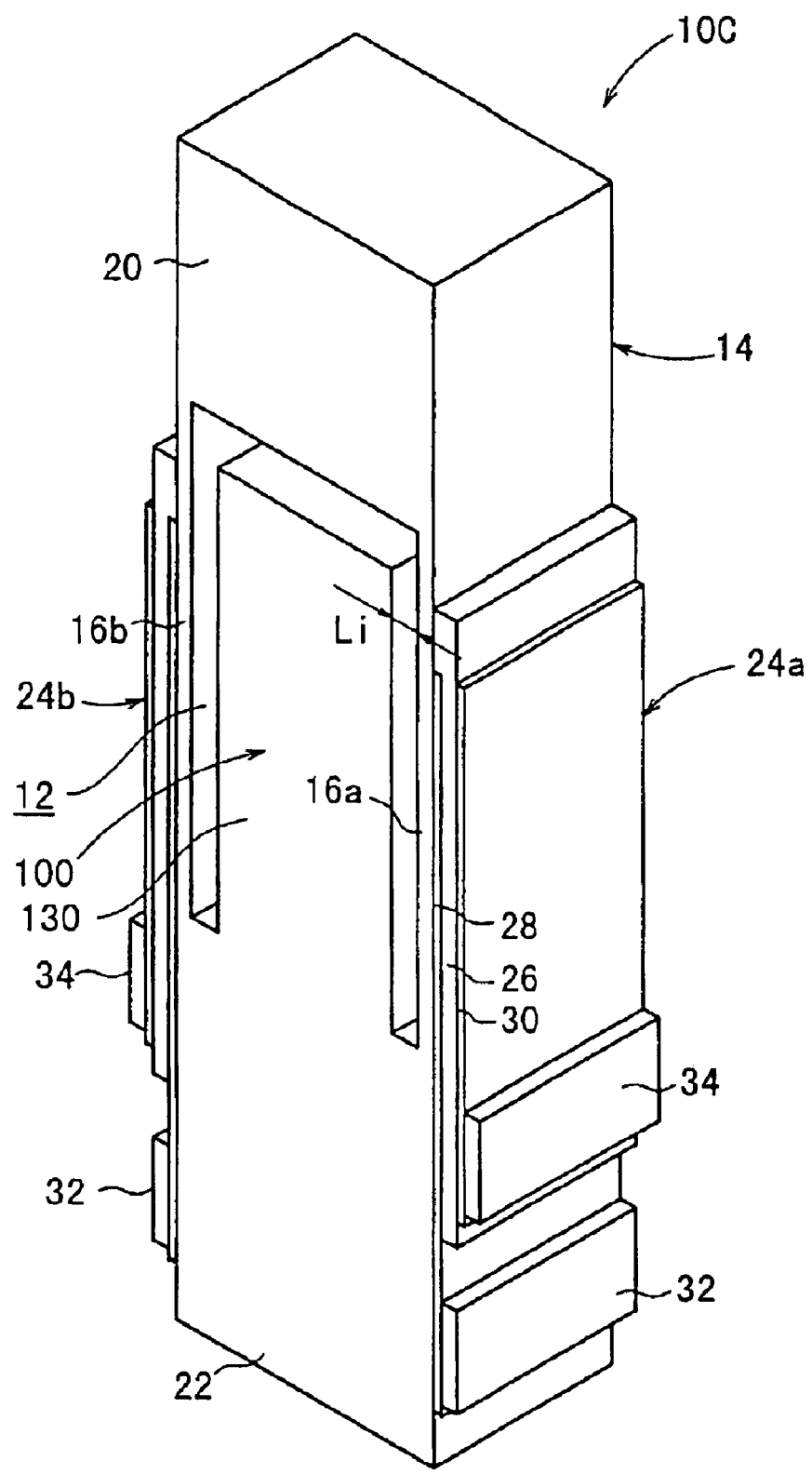
FIG. 22 shows a perspective view illustrating an arrangement of a piezoelectric/electrostrictive device according to a third embodiment.

As shown in FIG. 22, the piezoelectric/electrostrictive device 10G has substantially a similar constitution as the piezoelectric/electrostrictive device 10A according to the first embodiment, except that the mechanism 100 for restricting amplitude of the thin plate sections 16a and 16b includes a projecting portion 130 formed from the inner wall 22a of the fixing portion 22 into the hole 12 and a shortest distance Li from the projecting portion 130 to the thin plate sections 16a and 16b is not more than a tolerance limit of amplitude of the thin plate sections 16a and 16b.

Here, the tolerance limit is an amplitude of the thin plate sections 16a and 16b when the stress applied to the joined portion between the thin plate sections 16a and 16b and the movable section 20 and the joined potion between the thin plate sections 16a and 16b and the fixing section 22 is maximum (maximum value not to destroy).

In the piezoelectric/electrostrictive device 10C according to the third embodiment, the vibration (amplitude) of the movable section 20 and the thin plate sections 16a and 16b is not more than the tolerance limit. Thus, damages on the thin plate sections 16a and 16b can be prevented effectively. Especially in this arrangement, vibration (amplitude) causing a damage on the thin plate sections 16a and 16b is restricted effectively when an external force is applied to the thin plate sections 16a and 16b directly (and intensively), which is effective in preventing the damage on the thin plate sections 16a and 16b.

Figure 23:
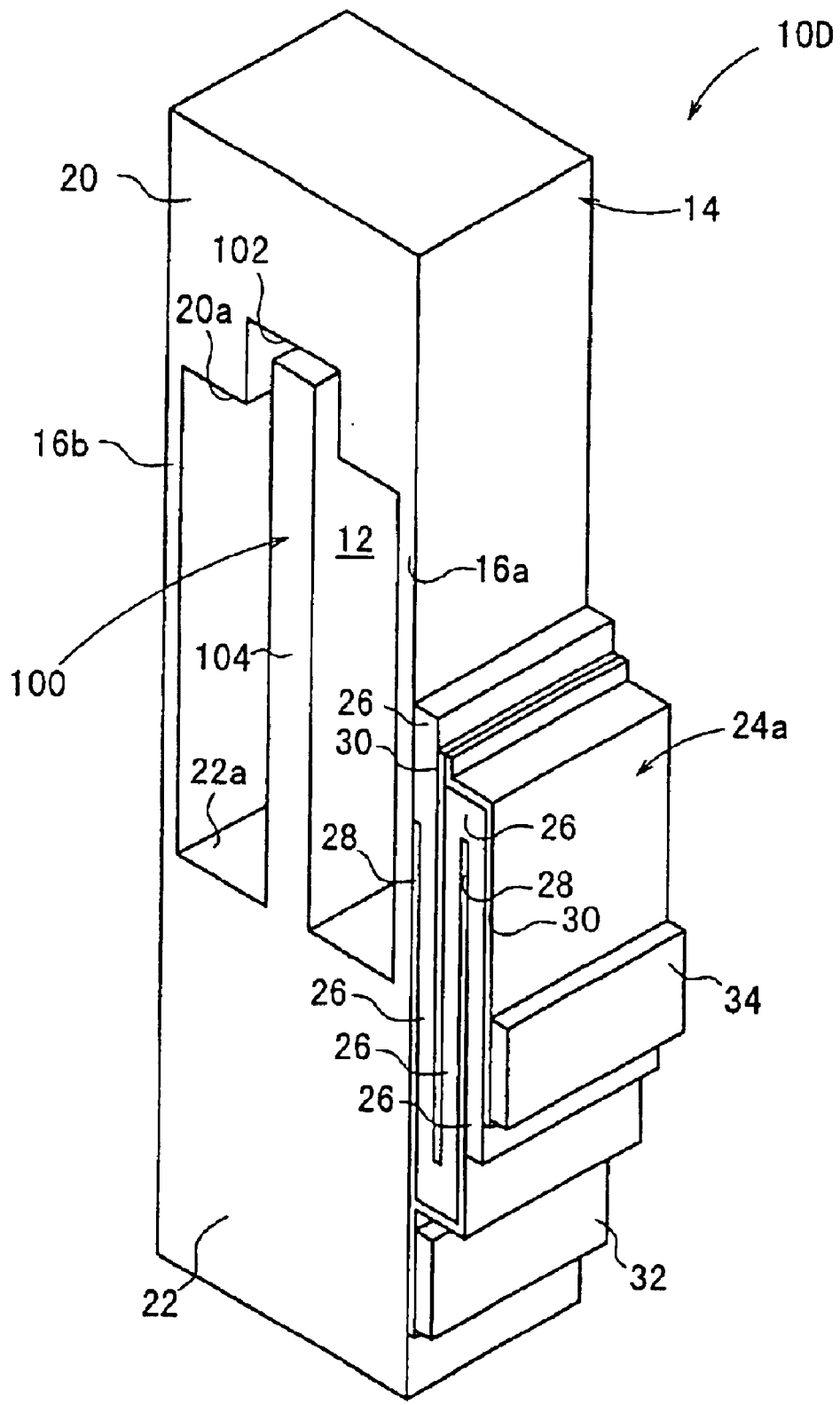
FIG. 23 shows a perspective view illustrating an arrangement of a piezoelectric/electrostrictive device according to a fourth embodiment.
Figure 24:
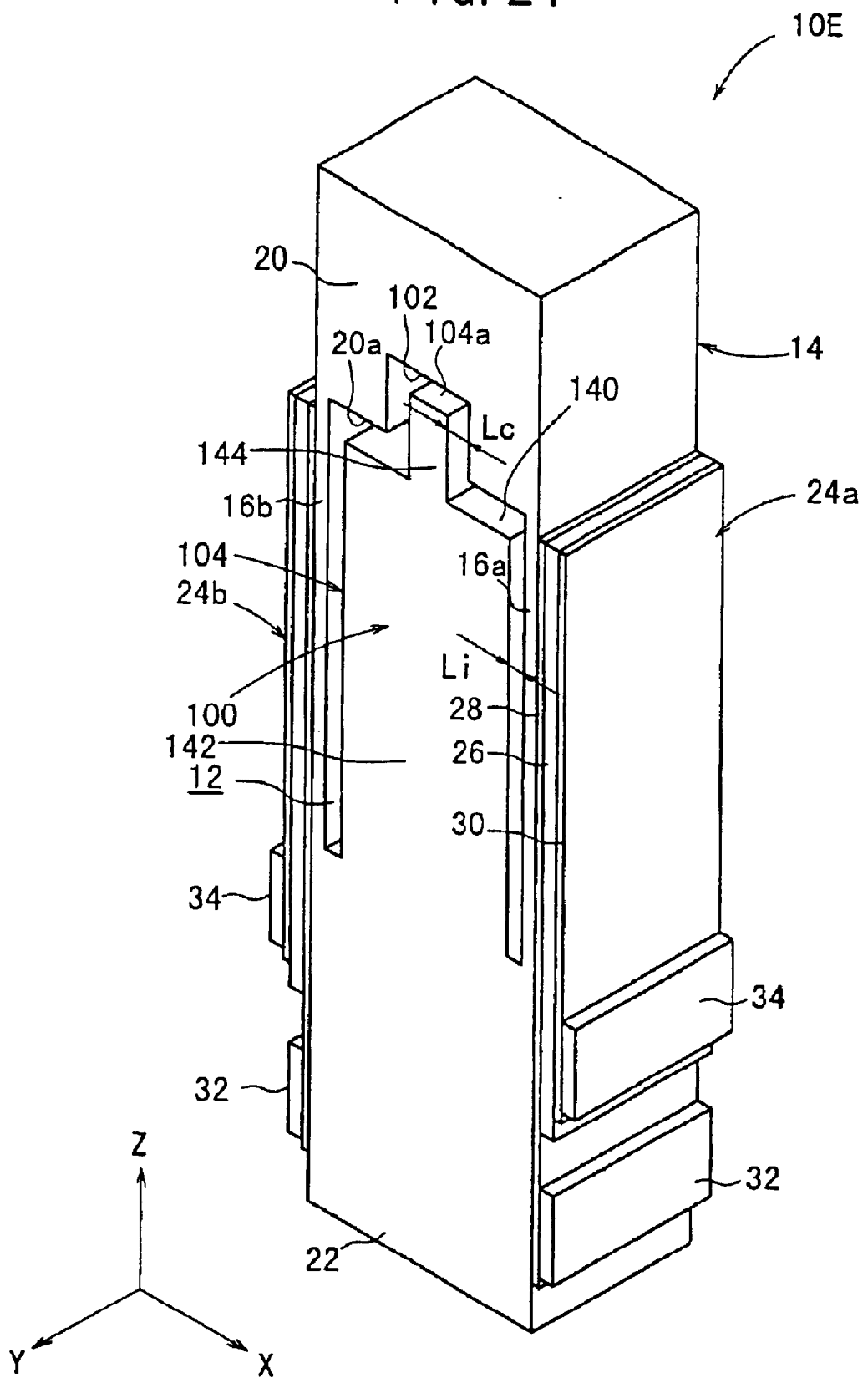
FIG. 24 shows a perspective view illustrating an arrangement of a piezoelectric/electrostrictive device according to a fifth embodiment.
Figure 25:
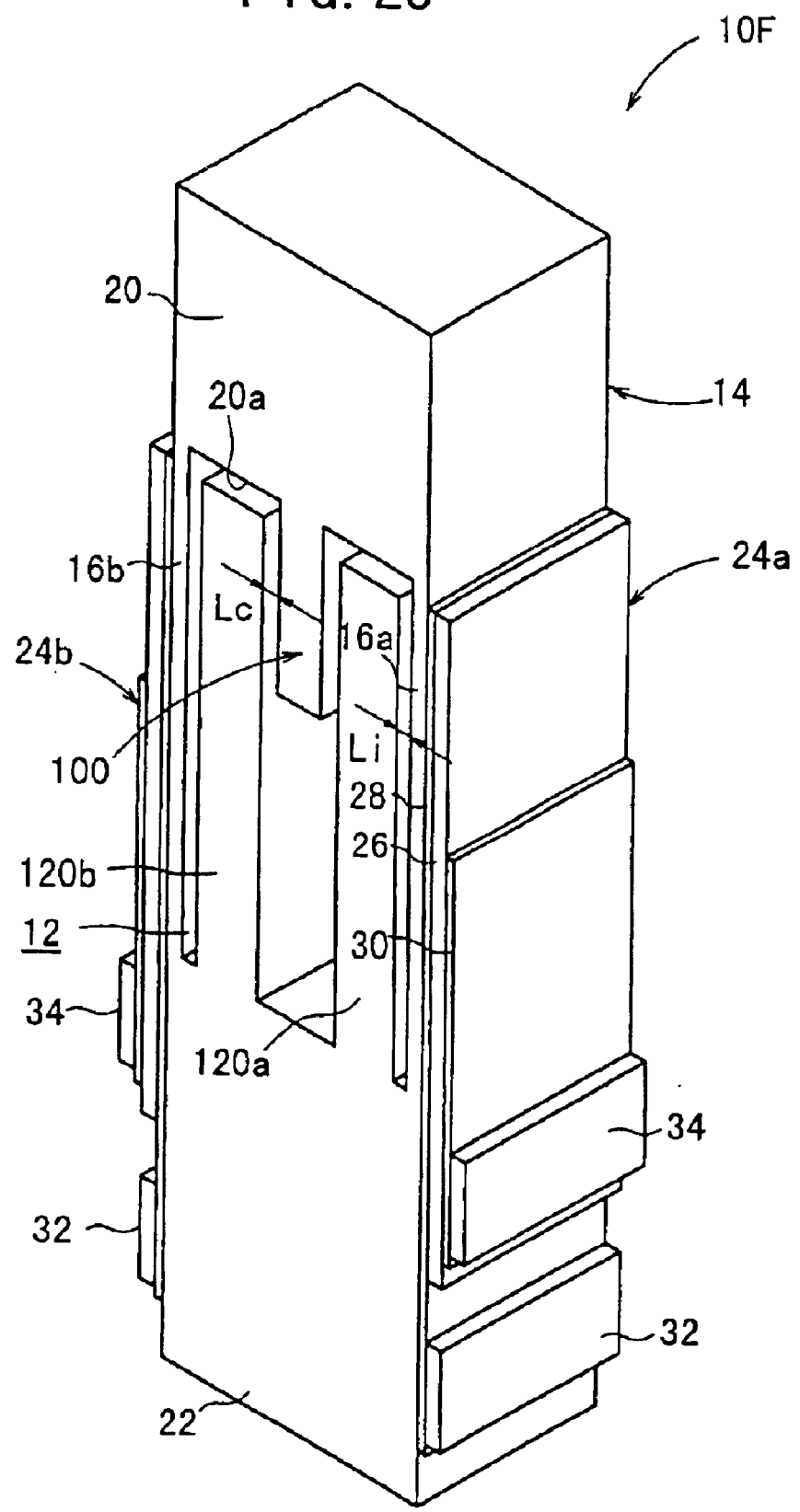
FIG. 25 shows a perspective view illustrating an arrangement of a piezoelectric/electrostrictive device according to a sixth embodiment.

While the example where the piezoelectric/electrostrictive elements 24a and 24b are formed on the pair of the thin plate sections 16a and 16b is described above, it is possible that the piezoelectric/electrostrictive element 24a is formed on one thin plate section 16a as shown in the piezoelectric/electrostrictive device 10D according to the fourth embodiment in FIG. 23.

The piezoelectric/electrostrictive device 10D, in which the piezoelectric/electrostrictive element 24a is formed on only one thin plate section 16a of the pair of mutually opposing thin plate sections 16a and 16b as described above, makes it possible to decrease the rigidity of the thin plate section 16b on which the piezoelectric/electrostrictive element 24b is not formed.

As a result, when comparison may be made concerning the magnitude of the displacement obtained by operating one piezoelectric/electrostrictive element 24a, between the piezoelectric/electrostrictive device (for example, piezoelectric/electrostrictive device 10Ag as shown in FIG. 8), in which the piezoelectric/electrostrictive elements 24a and 24a are formed on both sides and the piezoelectric/electrostrictive device 10D, in which the piezoelectric/electrostrictive element 24a is farmed on only one side, the piezoelectric/electrostrictive device 10D, in which the piezoelectric/electrostrictive element 24a is formed on only one side, has such a feature that it is possible to obtain greater displacement owing to the effect that the rigidity of the thin plate section 16b disposed on the opposed side is low.

In the piezoelectric/electrostrictive device 10A according to the first embodiment and each of the modified examples 10Aa to 10Ai, a plate-shaped member is provided as the stopper member 104. However, alternatively, as shown in the piezoelectric/electrostrictive device 10E according to a fifth embodiment in FIG. 24, a step 140 may be provided. That is, the stopper member 104 in the piezoelectric/electrostrictive device 10E according to the fifth embodiment includes a combination of the stopper member 104 of the piezoelectric/electrostrictive device 10A according to the first embodiment and the projecting portion 130 of the piezoelectric/electrostrictive device 10C according to the third embodiment. In this arrangement, a thin portion 144 with smaller thickness in the X-axis direction is formed integrally into center of a top portion of a thick portion 142 with larger thickness in the X-axis direction. A forward end 104a of the thin portion 144 is arranged to enter the cavity portion 102 provided on the inner wall 20a of the movable section 20. A shortest distance Li from the thick portion 142 to the thin plate sections 16a and 16b and a shortest distance Lc from the forward end 104a of the thin portion 144, which enters the cavity portion 102, to an inner wall 102a of the cavity portion 102 in a direction in which the movable section 20 is displaced are set to not more than the tolerance limit of the amplitude of the thin plate sections 16a and 16b.

In this arrangement, the piezoelectric/electrostrictive device 10E gets totally stronger against the external force from its side surface (X-axis direction). Thus, it can further improve the shock resistance against the external force applied to the movable section 20 and the thin plate sections 16a and 16b.

In the piezoelectric/electrostrictive device 10B according to the second embodiment, thin plate-shaped members are provided as the buffer members 120a and 120b, respectively. However, alternatively, as shown in the piezoelectric/electrostrictive device 10F according to a sixth embodiment in FIG. 25, they can be thicker. A shortest distance Li from the respective buffer members 120a and 120b to the thin plate sections 16a and 16b and a shortest distance Lc from the forward end 122a of the stopper member 122 to respective buffer members 120a and 120b in a direction in which the movable section 20 is displaced may be set to not more than the tolerance limit of the amplitude of the thin plate sections 16a and 16b.

Also in this arrangement, the piezoelectric/electrostrictive device 10F gets totally stronger against the external force from its side surface (X-axis direction). Thus, it can further improve the shock resistance against the external force applied to the movable section 20 and the thin plate sections 16a and 16b.

Figure 19:
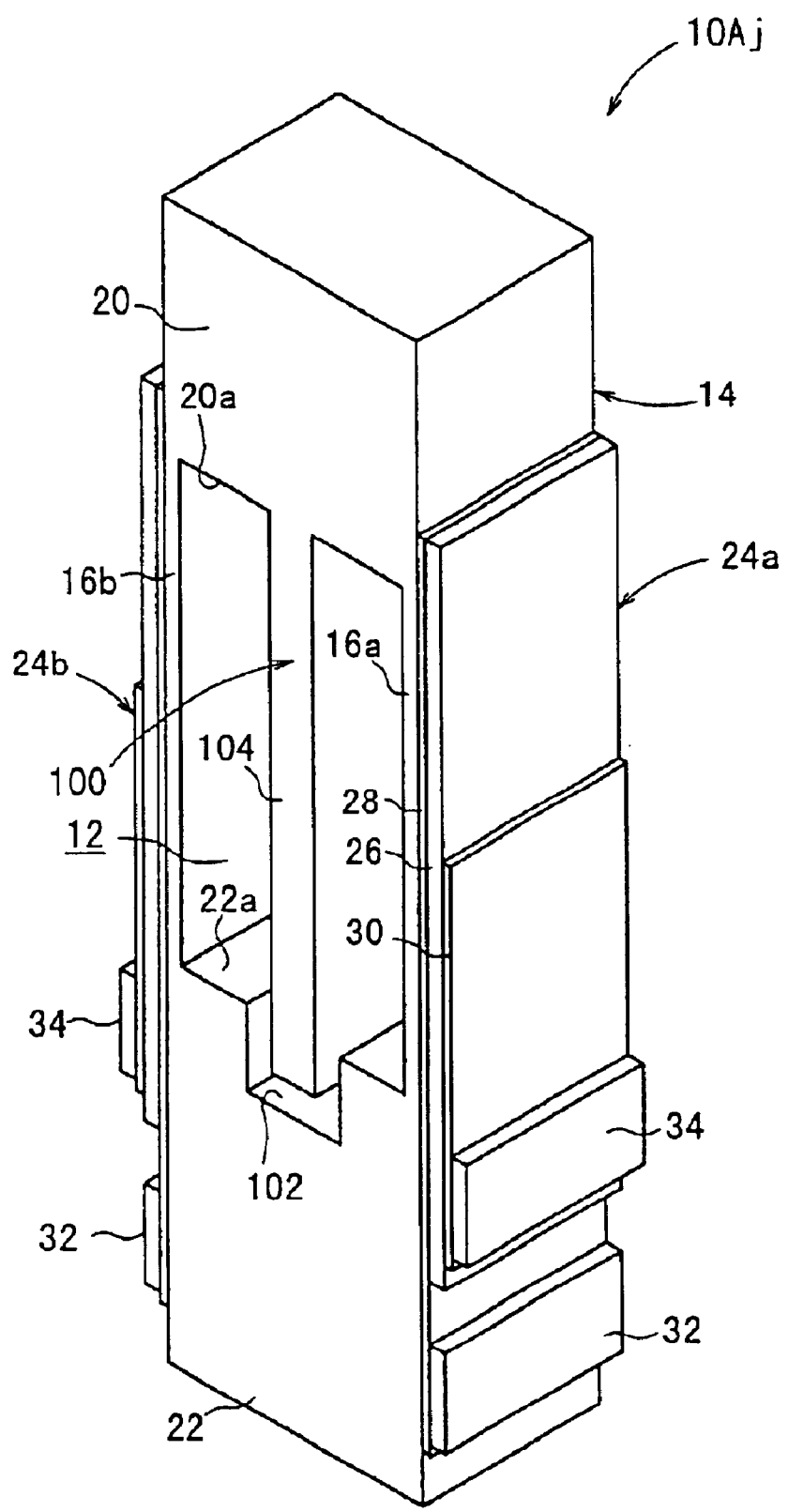
FIG. 19 shows a perspective view illustrating a tenth modified example of a piezoelectric/electrostrictive device according to the first embodiment.

The structure of the piezoelectric/electrostrictive device 10F according to the sixth embodiment can be applied to the 10th modified example (10Aj) of the piezoelectric/electrostrictive device 10A according to the first embodiment shown in FIG. 19 and the modified example (10Ba) of the piezoelectric/electrostrictive device 10B according to the second embodiment shown in FIG. 21.

As shown in FIGS. 19 and 21, when the movable section is provided with the stopper member 104 or the buffer members 120a and 120b, the weight of the movable section 20 increases. As a result, its response performance is reduced to some extent if it is used as an actuator. However, it is effective for improving the detection sensitivity when it is used as a sensor using inertial weight like an acceleration sensor.

The piezoelectric/electrostrictive device described above can be utilized as the active device including, for example, vibrators, resonators, oscillators, and discriminators for the communication and the power generation, various transducers, various actuators, frequency region functional parts (filters), transformers, as well as the sensor element for various sensors including, for example, ultrasonic sensors, acceleration sensors, angular velocity sensors, shock sensors and mass sensors. Especially, The piezoelectric/electrostrictive device can be preferably utilized for various actuators to be used for the mechanism for adjusting the displacement and the positioning and for adjusting the angle for various precision parts such as those of optical instruments and precision mechanical equipment.

It is a matter of course that the piezoelectric/electrostrictive device and the method of producing the same according to the invention are not limited to the embodiments described above, which may be embodied in other various forms without deviating from the gist or essential characteristics of the invention.

What is claimed is:

1. A method of producing a piezoelectric/electrostrictive device having a pair of mutually opposing thin plate sections, a movable section, and a fixing section for supporting said thin plate sections and said movable section, said piezoelectric/electrostrictive device comprising:

one or more piezoelectric/electrostrictive elements arranged on at least one thin plate section of said pair of thin plate sections; and a hole formed by both inner walls of said pair of thin plate sections, an inner wall of said movable section, and an inner wall of said fixing section, comprising the step of:

producing said piezoelectric/electrostrictive device and forming a mechanism for restricting amplitude of said thin plate sections by cutting off a predetermined portion of said thin plate sections after forming said piezoelectric/electrostrictive elements on at least the thin plate sections.

2. The method for producing a piezoelectric/electrostrictive device according to claim 1, wherein said thin plate sections, said fixing section, said movable section and said mechanism for restricting amplitude of said thin plate sections are formed by a ceramic laminate, said ceramic laminate being produced by firing a ceramic green laminate containing first ceramic green sheets, second ceramic green sheets for constituting said mechanism for restricting amplitude of said thin plate sections and third ceramic green sheets for constituting said thin plate sections integrally, said first ceramic green sheets each having a window for forming at least said hole; and forming said piezoelectric/electrostrictive elements on a part of an outer surface of said ceramic laminate for constituting said thin plate sections said method further comprising the step of producing said piezoelectric/electrostrictive device having said mechanism for restricting amplitude of said thin plate sections by cutting at least once said ceramic laminate having said piezoelectric/electrostrictive element.

3. A method of producing a piezoelectric/electrostrictive device, comprising the steps of:

providing a precursor structure including a portion for defining a fixing section, a portion for defining a pair of mutually opposing thin plate sections, and a portion for defining movable sections at distal ends of the thin plate sections; and subsequently performing a cutting operation on said thin plate sections to form (i) the fixing section for supporting the pair of mutually opposing thin plate sections having movable sections at distal ends thereof, (ii) a hole defined by both inner walls of the pair of thin plate sections, an inner wall of the movable section, and an inner wall of the fixing section, and (iii) a mechanism for restricting amplitude of the thin plate sections.

* * * * *

UNITED STATES PATENT AND TRADEMARK OFFICE
CERTIFICATE OF CORRECTION

PATENT NO. : 6,796,011 B2
DATED : September 28, 2004
INVENTOR(S) : Yukihisa Takeuchi et al.

It is certified that error appears in the above-identified patent and that said Letters Patent is hereby corrected as shown below:

Column 1,
Line 32, change "o" to -- of --
Line 64, change "IP" to -- JP --

Column 2,
Line 60, change "vibration" to -- vibrations --

Column 5,
Line 15, change "Section" to -- section --

Column 7,
Line 34, change "Detailed" to -- DETAILED --

Column 8,
Line 4, chane "24*a*" to -- 24*b* --
Lines 7, 31, 33, 37, 47 and 49, change the second occurrence of "24*a*" to -- 24*b* --

Column 10,
Lines 49 and 65, change the second occurrence of "24*a*" to -- 24*b* --

Column 11,
Line 12, change the second occurrence of "34*a*" to -- 34*b* --
Lines 21 and 40, change "24*a*" to -- 24*b* --

Column 13,
Line 37, change the second occurrence of "24*a*" to -- 24*b* --
Line 39, change "24*a*" to -- 24*b* --

Column 23,
Lines 24, 29 and 62, change the second occurrence of "24*a*" to -- 24*b* --

Column 24,
Line 4, change the second occurrence of "24*a*" to -- 24*b* --

Column 26,
Line 66, change "10G" to -- 10C --

UNITED STATES PATENT AND TRADEMARK OFFICE
CERTIFICATE OF CORRECTION

PATENT NO. : 6,796,011 B2
DATED : September 28, 2004
INVENTOR(S) : Yukihisa Takeuchi et al.

It is certified that error appears in the above-identified patent and that said Letters Patent is hereby corrected as shown below:

Column 27,
Line 46, change "24*a*" to -- 24*b* --

Signed and Sealed this

Fifteenth Day of March, 2005

JON W. DUDAS
*Director of the United States Patent and Trademark Office*